United States Patent
Northcutt et al.

(10) Patent No.: US 9,431,955 B1
(45) Date of Patent: Aug. 30, 2016

(54) MONOLITHIC COMPOSITE RESONATOR DEVICES WITH REDUCED SENSITIVITY TO ACCELERATION AND VIBRATION

(71) Applicant: Integrated Device Technology, Inc., San Jose, CA (US)

(72) Inventors: James Bryan Northcutt, Lehigh Acres, FL (US); Eugene Stanley Trefethen, Fort Myers, FL (US); Harry LeRoy Sutter, Cape Coral, FL (US); Stephen Amar Tibbitts, Spanaway, WA (US); Charles Michael Rice, Cape Coral, FL (US); Bruce Edward Clark, Puyallup, WA (US)

(73) Assignee: INTEGRATED DEVICE TECHNOLOGY, iNC., San Jose, CA (US)

(*) Notice: Subject to any disclaimer, the term of this patent is extended or adjusted under 35 U.S.C. 154(b) by 0 days.

(21) Appl. No.: 14/985,689

(22) Filed: Dec. 31, 2015

(51) Int. Cl.
*H03B 5/04* (2006.01)
*H03B 5/32* (2006.01)
*H03H 9/10* (2006.01)
*H03H 9/13* (2006.01)
*H03H 9/205* (2006.01)

(52) U.S. Cl.
CPC ........ *H03B 5/04* (2013.01); *H03B 5/32* (2013.01); *H03H 9/10* (2013.01); *H03H 9/13* (2013.01); *H03H 9/205* (2013.01)

(58) Field of Classification Search
CPC ............ H03B 5/04; H03B 5/30; H03B 5/32; H03B 5/323; H03B 5/36; H03B 5/362; H03B 5/364; H03H 9/10; H03H 9/125; H03H 9/13; H03H 9/15; H03H 9/17; H03H 9/19; H03H 9/205

USPC ........ 331/66, 68, 69, 116 FE, 116 M, 116 R, 331/132, 154, 158, 162, 176
See application file for complete search history.

(56) References Cited

U.S. PATENT DOCUMENTS

| | | | | |
|---|---|---|---|---|
| 4,076,987 A | * | 2/1978 | Zumsteg | G04F 5/063 310/361 |
| 4,317,059 A | | 2/1982 | Besson | |
| 4,365,182 A | * | 12/1982 | Ballato | H03H 9/566 310/361 |
| 4,410,822 A | | 10/1983 | Filler | |
| 4,451,755 A | | 5/1984 | Vig et al. | |
| 4,575,690 A | * | 3/1986 | Walls | H03B 5/32 331/116 R |
| 4,609,885 A | | 9/1986 | Renoult | |
| 4,870,313 A | * | 9/1989 | Hirama | H03B 5/323 310/312 |
| 7,915,965 B2 | * | 3/2011 | Hardy | G01P 15/097 310/348 |
| 8,188,800 B2 | | 5/2012 | Fry et al. | |

(Continued)

*Primary Examiner* — Levi Gannon
(74) *Attorney, Agent, or Firm* — Myers Bigel & Sibley P.A.

(57) ABSTRACT

An integrated circuit device includes a pair of serially-connected crystal resonators arranged as a first crystal resonator, which is configured to preferentially support a fundamental resonance mode in response to an input signal, and a second crystal resonator, which is configured to preferentially support a third or higher overtone resonance mode in response to a signal generated at an output terminal of the first crystal resonator. A negative impedance converter (NIC) is also provided, which has an input terminal electrically connected to an input terminal of the first crystal resonator and an output terminal electrically connected to one of the output terminal of the first crystal resonator and the output terminal of the second crystal resonator. The NIC may be a CMOS-based NIC that is devoid of inductive reactance from a passive inductor.

16 Claims, 28 Drawing Sheets

(56) References Cited

U.S. PATENT DOCUMENTS

| | | | |
|---|---|---|---|
| 8,298,486 B2 * | 10/2012 | Watanabe | G01G 3/13 422/50 |
| 8,525,607 B2 | 9/2013 | Fry et al. | |
| 8,902,529 B1 * | 12/2014 | Bennett | H03B 1/00 331/47 |
| 9,054,635 B2 | 6/2015 | Fry et al. | |
| 2004/0155716 A1 * | 8/2004 | Sasaki | H03H 9/132 331/158 |
| 2008/0136542 A1 * | 6/2008 | Hirama | H03B 5/30 331/116 R |
| 2010/0019688 A1 * | 1/2010 | Choi | H05B 41/2824 315/291 |
| 2011/0156823 A1 * | 6/2011 | Koyama | H03L 1/023 331/66 |
| 2013/0027141 A1 * | 1/2013 | Koyama | H03H 3/02 331/66 |
| 2014/0266482 A1 * | 9/2014 | Ishii | H03B 5/30 331/154 |

* cited by examiner

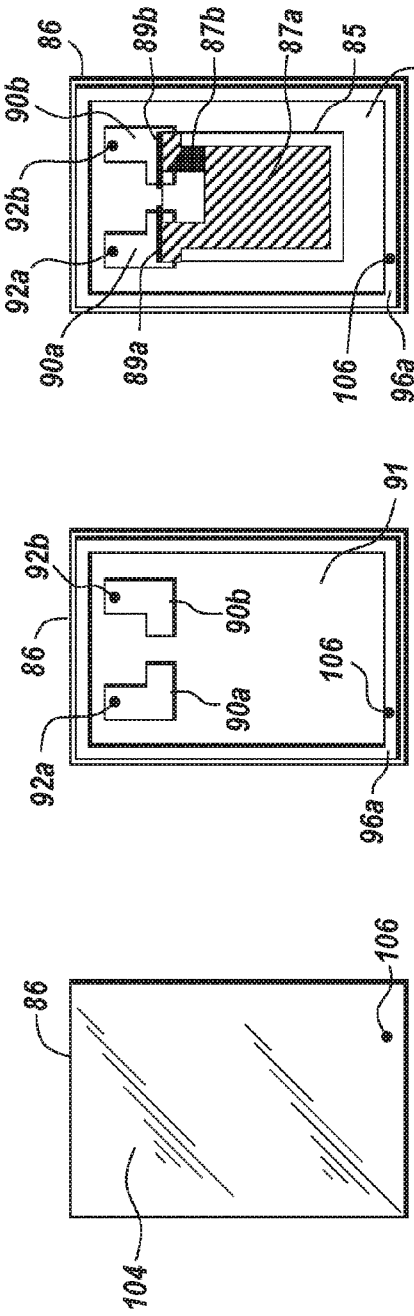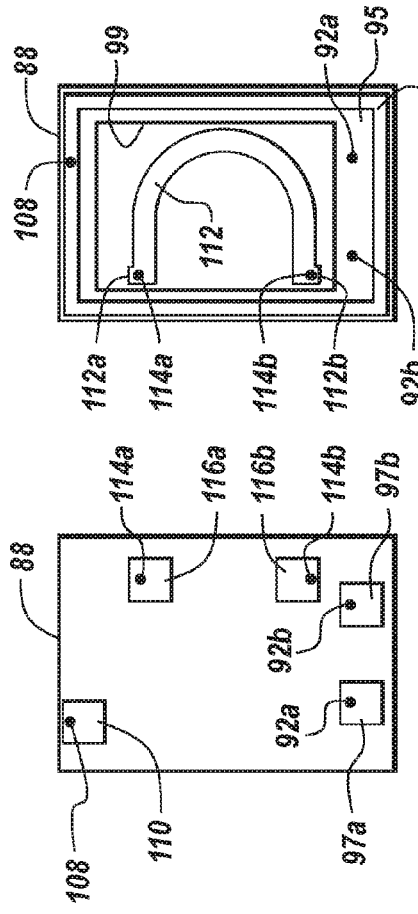

MONOLITHIC COMPOSITE RESONATOR DEVICES WITH REDUCED SENSITIVITY TO ACCELERATION AND VIBRATION

CROSS-REFERENCE TO RELATED APPLICATION

This application is related to U.S. application Ser. No. 14/871,411, filed Sep. 30, 2015, entitled "Packaged Oscillators With Built-In Self-Test Circuits that Support Resonator Testing with Reduced Pin Count," and U.S. application Ser. No. 14/586,508, filed Dec. 30, 2014, entitled "Integrated Circuit Device Substrates Having Packaged Crystal Resonators Thereon," now U.S. Pat. No. 9,306,537, the disclosures of which are hereby incorporated herein by reference.

FIELD OF THE INVENTION

The present invention relates to integrated circuit devices and methods of forming same and, more particularly, to resonator devices and oscillator circuits and methods of forming same on integrated circuit substrates.

BACKGROUND OF THE INVENTION

Current state-of-the art microelectromechanical (MEMs) resonators have recently challenged the quartz-dominated timing industry, notwithstanding the perceived temperature instabilities of such MEMs devices, which has led to the development of very high performance temperature sensors in MEMs-based circuits to thereby support levels of frequency stability that are typically associated with crystal oscillators (XO). Moreover, because one of the significant advantages of MEMs-based technology is the highly integrated semiconductor manufacturing technologies that support high volume wafer-level encapsulation of MEMs components, efforts have been made to determine how crystal-based resonators can benefit from similar wafer-level scale and vacuum sealing packaging technologies. One example of a wafer-scale packaging technology is disclosed in U.S. Pat. No. 7,955,885 to Bhugra et al., entitled "Methods of Forming Packaged Micro-Electromechanical Devices," the disclosure of which is hereby incorporated herein by reference.

An example of a conventional real time clock (RTC) module includes a hybrid combination of an application specific integrated circuit (ASIC) and a crystal blank inside a ceramic package. However, as disclosed in an article by Ruffieux et al., entitled "A Versatile Timing Microsystem Based on Wafer-Level Packaged XTAL/BAW Resonators with Sub-uW RTC Mode and Programmable HF Clocks," 2013 IEEE International Solid-State Circuits Conference, Feb. 19, 2013, pp. 196-198, a ceramic package may be replaced with silicon and the circuit may be implemented as an active part of the package. U.S. Pat. No. 8,035,454 to Navet discloses a crystal oscillator device containing a piezoelectric resonator element and integrated circuit (IC) chip within a vacuum chamber.

Quartz, MEMs and LC-based timing applications can utilize inductors to support resonance frequencies and/or timing circuit operation (e.g., VCO operation). However, achieving high-quality (i.e., high-Q) inductors can often be difficult using conventional wafer-scale fabrication techniques. As will be understood by those skilled in the art, high-Q inductors require low series resistance, smooth metal surfaces and small grain structure. Typical inductor materials include copper and silver, but not aluminum. Moreover, because inductors create surrounding fields, forming inductors adjacent lossy materials will significantly reduce their Q. Accordingly, high value inductors, such as spiral inductors, may provided insufficiently high Q when formed on an integrated circuit (IC) substrate having relatively low resistivity. One example of a spiral inductor is disclosed in commonly assigned U.S. Pat. No. 6,798,039 to Gillespie et al., entitled "Integrated Circuit Inductors Having High Quality Factors," the disclosure of which is hereby incorporated herein by reference. Another example of an inductor that utilizes encapsulating shielding layers to inhibit a loss in Q is disclosed in commonly assigned U.S. Pat. No. 8,164,159 to Armstrong et al., entitled "Semiconductor Resonators with Electromagnetic and Environmental Shielding and Methods of Forming Same," the disclosure of which is hereby incorporated herein by reference.

Efforts have also been made to manufacture packaged crystal-based oscillator circuits having reduced sensitivity to acceleration and vibration forces. One such effort is disclosed in U.S. Pat. No. 4,575,690 to Walls et al., entitled "Acceleration Insensitive Oscillator," which discloses a crystal-based oscillator circuit including two crystals of unequal acceleration sensitivity magnitude and mounted such that their respective acceleration sensitivity vectors are aligned in an anti-parallel relationship. Similar efforts are also disclosed in U.S. Pat. No. 7,915,965 to Hardy et al., entitled "Oscillator Having Reduced Sensitivity to Acceleration," and in U.S. Pat. Nos. 8,188,800, 8,525,607 and 9,054,635 to Fry et al., entitled "Crystal Oscillator with Reduced Acceleration Sensitivity."

SUMMARY OF THE INVENTION

Integrated circuit devices according to some embodiments of the invention include a pair of serially-connected crystal resonators arranged as a first crystal resonator, which is configured to preferentially support a fundamental resonance mode in response to an input signal, and a second crystal resonator, which is configured to preferentially support a third or higher overtone resonance mode in response to a signal generated at an output terminal of the first crystal resonator. A first negative impedance converter (NIC) is also advantageously provided. This first NIC has an input terminal electrically connected to an input terminal of the first crystal resonator and an output terminal electrically connected to one of: (i) the output terminal of the first crystal resonator, and (ii) the output terminal of the second crystal resonator. Preferably, the first NIC is a CMOS-based NIC that is devoid of inductive reactance from a passive inductor. According to further embodiments of the invention, the first NIC is a temperature-compensated NIC, which is responsive to a reference voltage having a magnitude that varies in response to changes in temperature of the pair of serially-connected crystal resonators. The first NIC may also be programmable (e.g., one-time programmable) using a resistor array, which is responsive to a multi-bit programming signal.

According to still further embodiments of the invention, an acceleration vector weighting circuit is provided so that the multi-resonator composite is less susceptible to acceleration forces (e.g., vibration). According to these embodiments, the weighting circuit has a first terminal electrically connected to an input terminal of the second crystal resonator and a second terminal electrically connected to the output terminal of the second crystal resonator. This weighting circuit is preferably a programmable circuit, which is configured to decrease an effective shunt capacitance of the second crystal resonator relative to the first crystal resonator. For example, the weighting circuit may be configured as a second NIC that is devoid of inductive reactance from a passive inductor.

An integrated circuit device according to still further embodiments of the invention includes a plurality of serially-connected resonators and a programmable negative impedance converter (NIC), which is configured to mimic a negative capacitive reactance and has at least a first terminal electrically connected to a first of the plurality of serially-connected resonators. This programmable NIC is preferably a CMOS-based NIC that is devoid of inductive reactance from a passive inductor. In some embodiments of the invention, the programmable NIC is a one-time programmable and temperature-compensated NIC, which is electrically connected across the first of the plurality of serially-connected resonators and is responsive to a reference voltage having a magnitude that varies in response to changes in temperature in the integrated circuit device. In additional embodiments of the invention, an integrated circuit substrate is provided with an at least two-piece package thereon. This package includes a sealed cavity containing the plurality of serially-connected resonators. In addition, at least a pair of the plurality of serially-connected resonators are oriented within the sealed cavity so that their respective net acceleration vectors are in antiparallel relative to each other. The programmable NIC may be a CMOS-based NIC that is embodied within the integrated circuit substrate, yet connected to terminals of the resonators within the sealed cavity. According to some of these embodiments of the invention, the programmable NIC is configured to preferentially weight a magnitude of a net acceleration vector associated with a first of the pair of serially-connected resonators relative to a magnitude of a net acceleration vector associated with a second of the pair of serially-connected resonators.

According to still further embodiments of the invention, an integrated circuit device is provided, which includes a monolithic multi-resonator device. This monolithic multi-resonator device includes a rectangular-shaped quartz blank having first and second pairs of electrodes thereon that define two quartz resonators, which are mechanically coupled in anti-parallel and have respective input and output terminals at opposing ends of the rectangular-shaped quartz blank. The first pair of electrodes includes a first top electrode and underlying first bottom electrode and the second pair of electrodes includes a second top electrode, which is patterned as a 180°-rotated version of the first top electrode, and an underlying second bottom electrode, which is patterned as a 180°-rotated version of the first bottom electrode. In some of these embodiments of the invention, the rectangular-shaped quartz blank may have a nonuniform thickness across its width so that a spacing between the first top and bottom electrodes is unequal to a spacing between the second top and bottom electrodes. An at least two-piece package is also provided having a sealed cavity therein containing the monolithic multi-resonator device. The two quartz resonators are electrically connected in series within the at least two-piece package. An integrated circuit substrate is also provided having a programmable negative impedance converter (NIC) therein. This NIC is configured to mimic a negative capacitive reactance. The programmable NIC has first and second terminals electrically connected to corresponding input and output terminals of one of the two quartz resonators within the at least two-piece package. This programmable NIC is preferably configured as a CMOS-based NIC that is devoid of inductive reactance from a passive inductor.

BRIEF DESCRIPTION OF THE DRAWINGS

FIG. 9A is a top-down plan view of the packaged crystal resonator and inductor of FIG. 8A, according to an embodiment of the invention.

FIG. 9B is a bottom-up plan view of a package cap of FIG. 8A, according to an embodiment of the invention.

FIG. 9C is a bottom-up plan view of the package cap of FIG. 9B after mounting of a crystal resonator thereto, according to an embodiment of the invention.

FIG. 9D is a bottom-up plan view of a package base of FIG. 8A, according to an embodiment of the invention.

FIG. 9E is a top-down plan view of the package base of FIG. 8A, with a horseshoe-shaped inductor within a recess, according to an embodiment of the invention.

DETAILED DESCRIPTION OF EMBODIMENTS

Figure 1A:
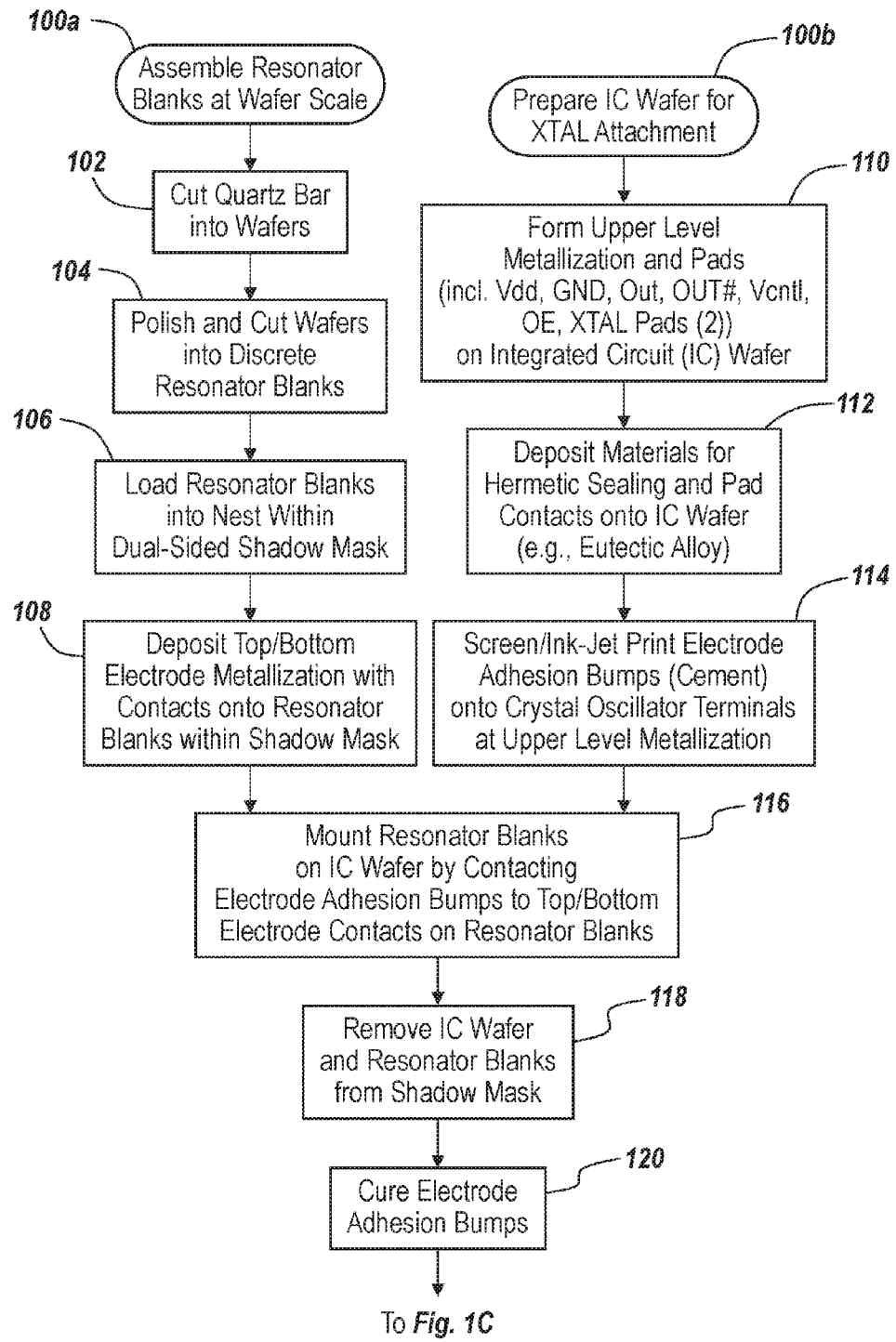
FIGS. 1A-1C are flow diagrams that illustrate methods of forming crystal-based oscillator circuits using wafer-scale fabrication techniques, according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
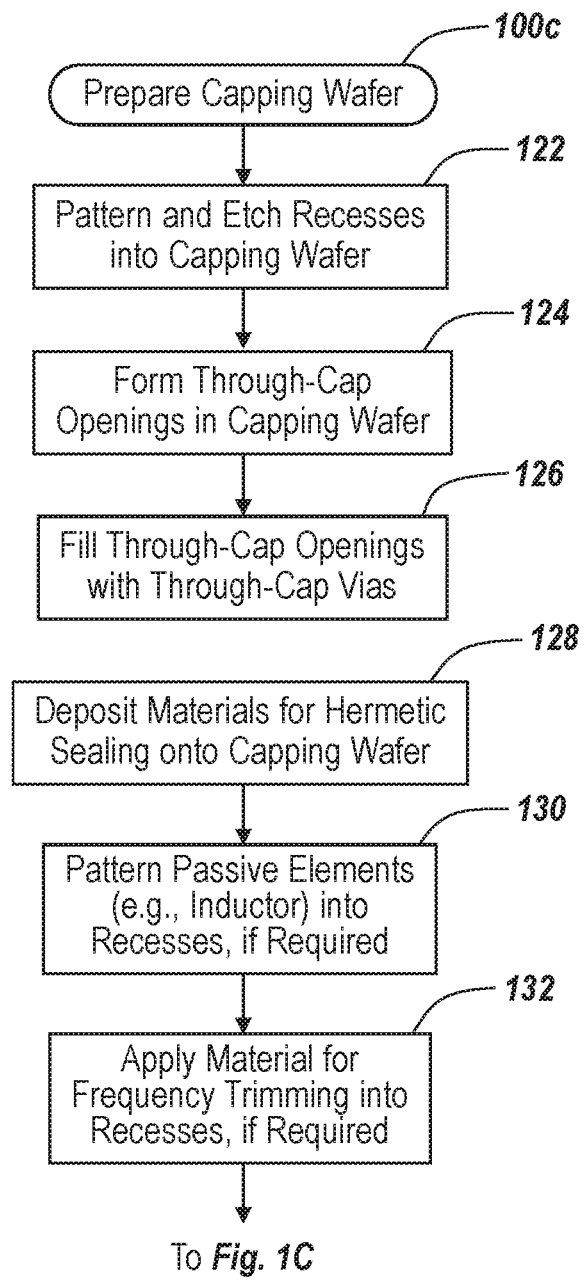
Figure 1C:
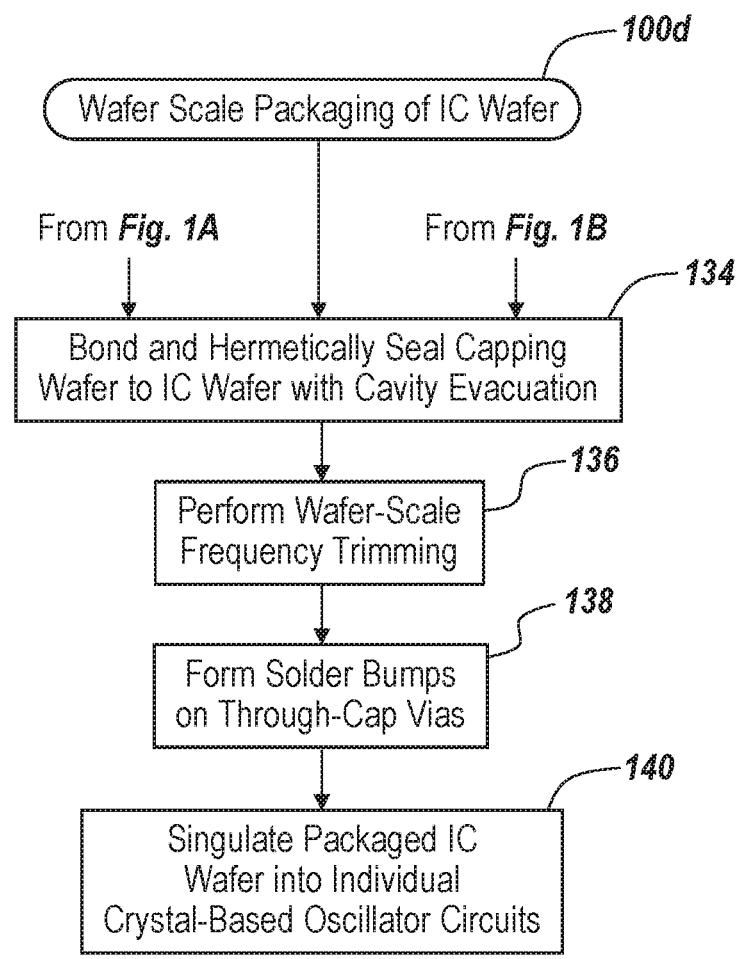

Referring now to FIGS. 1A-1C, methods of forming crystal-based oscillator circuits using wafer-scale fabrication techniques include: assembling resonator blanks at wafer scale 100a; preparing an integrated circuit (IC) wafer for crystal (XTAL) attachment 100b; preparing a capping wafer 100c; and performing wafer scale packaging of the IC wafer 100d. With respect to FIG. 1A, operations to assemble resonator blanks at wafer scale 100a may include cutting a bar of quartz into a plurality of wafers, Block 102, which are then polished and cut into discrete resonator blanks (e.g., rectangular resonator blanks), Block 104. The resonator blanks may be loaded into a quartz blank holder having a two-dimensional array of openings therein that span the active area of a semiconductor wafer. According to some embodiments of the invention, the quartz blank holder may include a nest, which is sandwiched between a pair of top and bottom shadow masks, Block 106. These shadow masks are utilized to define top and bottom electrodes on the resonator blanks. Thereafter, as shown by Block 108, top and bottom electrode metallization (with contact metallization) is deposited onto the resonator blanks within the shadow masks, Block 108. Although not shown, additional masks may also be used to enable the deposition of electrically conductive cement onto the contact metallization to thereby support attachment of the resonator blanks to an underlying integrated circuit wafer.

As shown by the right-side of FIG. 1A, operations to prepare an integrated circuit (IC) for crystal attachment 100b may include forming upper level metallization and external contact pads on a passivation layer, which covers an integrated circuit wafer having crystal-oscillator circuitry embedded therein, Block 110. According to some embodiments of the invention, the external contact pads may include a plurality of pads (e.g., six pads): a power supply contact pad (Vdd), a reference voltage contact pad (GND), a pair of differential periodic output signal pads OUT, OUT#, an input control voltage pad (Vcntl) and an output enable/disable pad (OE). Materials for hermetic sealing the IC wafer to a capping wafer may be selectively deposited onto the passivation layer, Block 112. The hermetic sealing material may be a eutectic alloy, which can also be deposited onto the external contact pads to enable electrical contact to corresponding through-substrate vias (within a capping wafer), as explained more fully hereinbelow. However, in alternative embodiments of the invention, a sealing material may be used that does not provide a fully hermetic seal. For example, the deposited sealing material may be suitable for glass frit bonding (a/k/a glass soldering, seal glass bonding), which utilizes a low melting temperature glass.

The step of forming the upper level metallization on the passivation layer, Block 110, may also include forming crystal oscillator terminals (in pairs) thereon. Thereafter, as illustrated by Block 114, electrode adhesion bumps (e.g., electrically conductive cement) may be deposited on the crystal oscillator terminals using, for example, screen or ink-jet printing. Other deposition techniques may also be used.

Referring still to FIG. 1A, the nested crystal resonator blanks may be mounted onto the integrated circuit wafer by contacting the electrode adhesion bumps to the top/bottom electrode contacts on the crystal resonator blanks, Block 116. As described above, the electrode adhesion bumps may be contacted directly to any electrically conductive cement on the top/bottom electrode contacts. This use of electrically conductive cement on the top/bottom electrode contacts of the resonator blanks may be particularly advantageous for overtone-mode resonator blanks (e.g., $3^{rd}$, $5^{th}$ overtone blanks) having sharp edges. As shown by Blocks 118, 120, the integrated circuit wafer (with resonator blanks mounted thereon) is removed from the shadow mask and the electrode adhesion bumps (e.g., conductive cement) are cured. In some embodiments of the invention, the curing of the adhesion bumps may be performed as a two-step cure process performed in a vacuum. In these embodiments, the first step is performed at a sufficiently high temperature to drive off volatiles in the cement and then the second step is performed at a higher temperature to increase the strength of the cement in supporting the resonator blanks. In still further embodiments of the invention, the contacting of the electrode adhesion bumps to the top/bottom electrode contacts, Block 116, may be performed using a pre-heated conductive cement.

As shown by FIG. 1B, operations to prepare a capping wafer 100c can include patterning and selectively etching deep recesses into a capping wafer, Block 122, using, for example, deep reactive ion etching (DRIE). These recesses may be rectangular in shape and of sufficient size to fully enclose subsequently received crystal resonator blanks, which are aligned 1:1 thereto when bonded to the integrated circuit wafer. As shown by Blocks 124-126, an array of through-cap openings, which may be formed to extend through the capping wafer, may be filled with through-cap electrically conductive vias/plugs. As described more fully hereinbelow, six openings may be formed around of each of the recesses in the capping wafer and filled to thereby enable electrical contact to the power supply contact pad (Vdd), the reference voltage contact pad (GND), the pair of differential periodic output signal pads OUT, OUT#, the input control voltage pad (Vcntl) and the output enable/disable pad (OE). Alternatively, four pads may be provided for signals OUT, OE, Vdd and GND, when only a single-sided output signal is required. As will be understood by those skilled in the art, the steps illustrated by Blocks 124-126 may actually be performed after the capping wafer and integrated circuit wafer have been bonded together.

Materials for hermetic sealing (e.g., eutectic metal) or non-hermetic sealing may be selectively deposited onto the capping wafer to support bonding operations, as explained hereinbelow, Block 128. If necessary, passive elements (e.g., inductor elements) may be formed or attached within the recesses in the capping wafer, Block 130, in addition to any material (e.g., electrically insulating material) used for frequency trimming (e.g., mass loading), Block 132.

Referring now to FIG. 1C, operations to perform wafer scale packaging of the integrated circuit wafer 100d may include bonding and sealing (e.g., hermetic or non-hermetic) the capping wafer to the integrated circuit wafer concurrently with performing vacuum evacuation of the cavities within the recesses in the capping wafer, Block 134. Thereafter, as shown by Block 136, wafer-scale frequency trimming operations may be performed on a device-by-device basis by removing electrode material from one or more of the quartz resonator blanks within the sealed recesses within the capping wafer or depositing material (e.g., insulating material or thinly deposited metal (e.g., Au)) onto the resonator blanks to support frequency adjustment through mass loading. Finally, as shown by Blocks 138 and 140, solder bumps (optional) may be formed on the electrically conductive through-cap vias in the capping wafer before the packaged crystal-based oscillator circuits are singulated into individual circuits by dicing the capping wafer (and underlying integrated circuit wafer) along a two-dimensional grid of dicing streets extending between the hermetically-sealed recesses within the capping wafer.

Figure 2A:
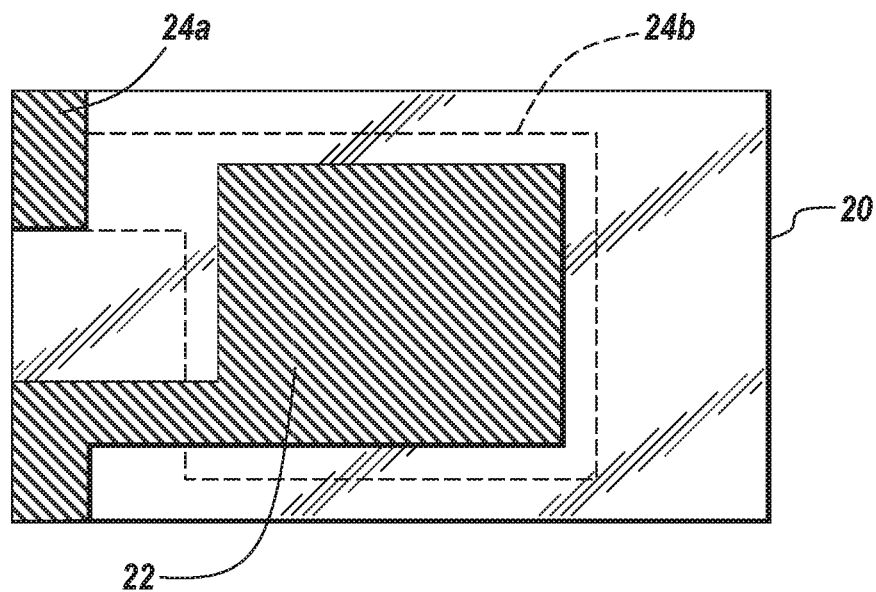
FIGS. 2A-2C are plan views of rectangular-shaped quartz resonator blanks having top and bottom electrodes formed thereon with top-side electrode contacts.
Figure 2B:
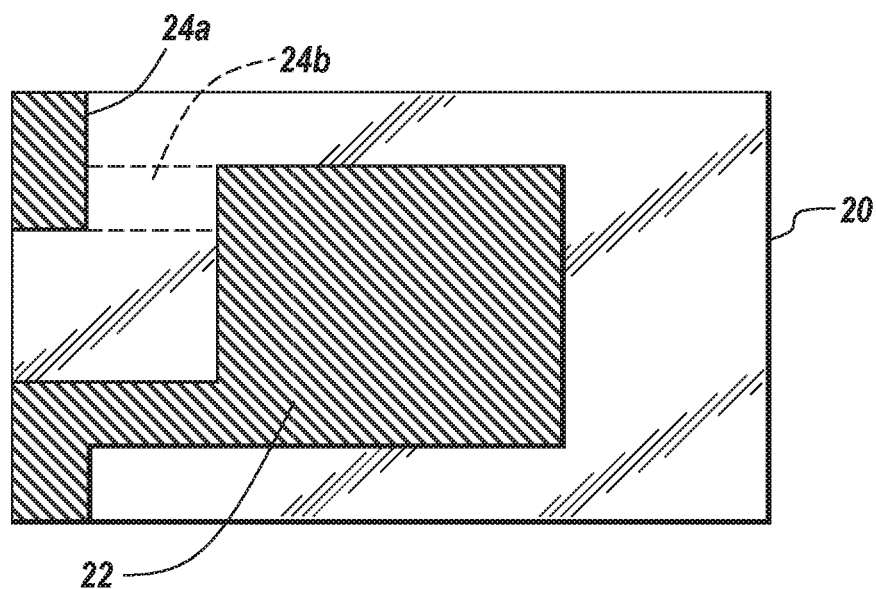
Figure 2C:
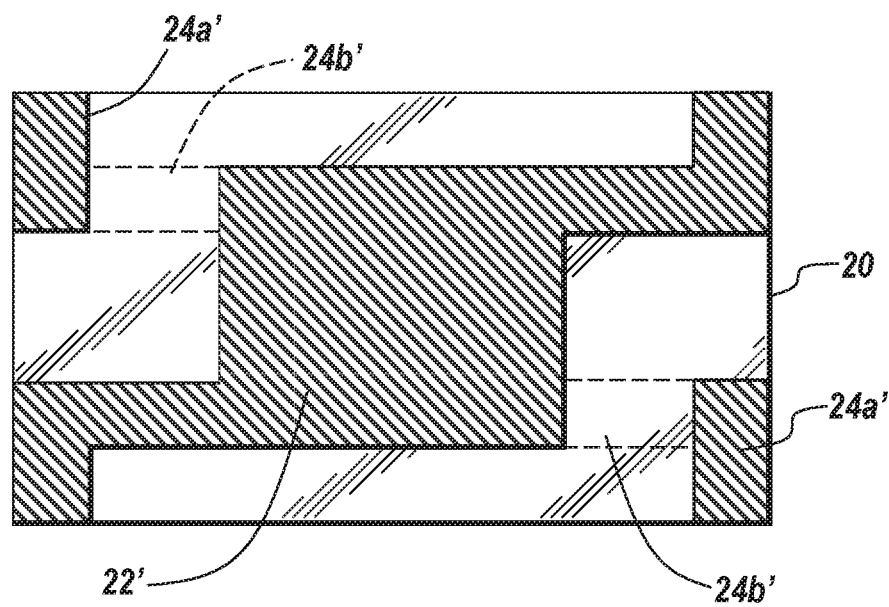

As described above with respect to Blocks 106-108 and 116, the resonator blanks with top/bottom electrode metallization may be configured as illustrated by FIGS. 2A-2C. In particular, as shown by FIG. 2A, a quartz resonator blank 20 may include a top electrode and contact 22 thereon, which is smaller in length and width dimensions relative to a bottom electrode 24b (with top-side bottom electrode contact 24a). In contrast, FIG. 2B illustrates a quartz resonator blank 20 having a top electrode and contact 22 thereon, which is equivalent in dimensions relative to a bottom electrode 24b (with top-side bottom electrode contact 24a). FIG. 2C illustrates a quartz resonator blank 20 having a top electrode 22' with diagonally opposite contacts and a bottom electrode 24b' with diagonally opposite top-side contacts 24a', which enable multiple orientations (e.g., 180° rotations) of the blank 20 within a quartz holder prior to mounting to an integrated circuit wafer.

Figure 3A:
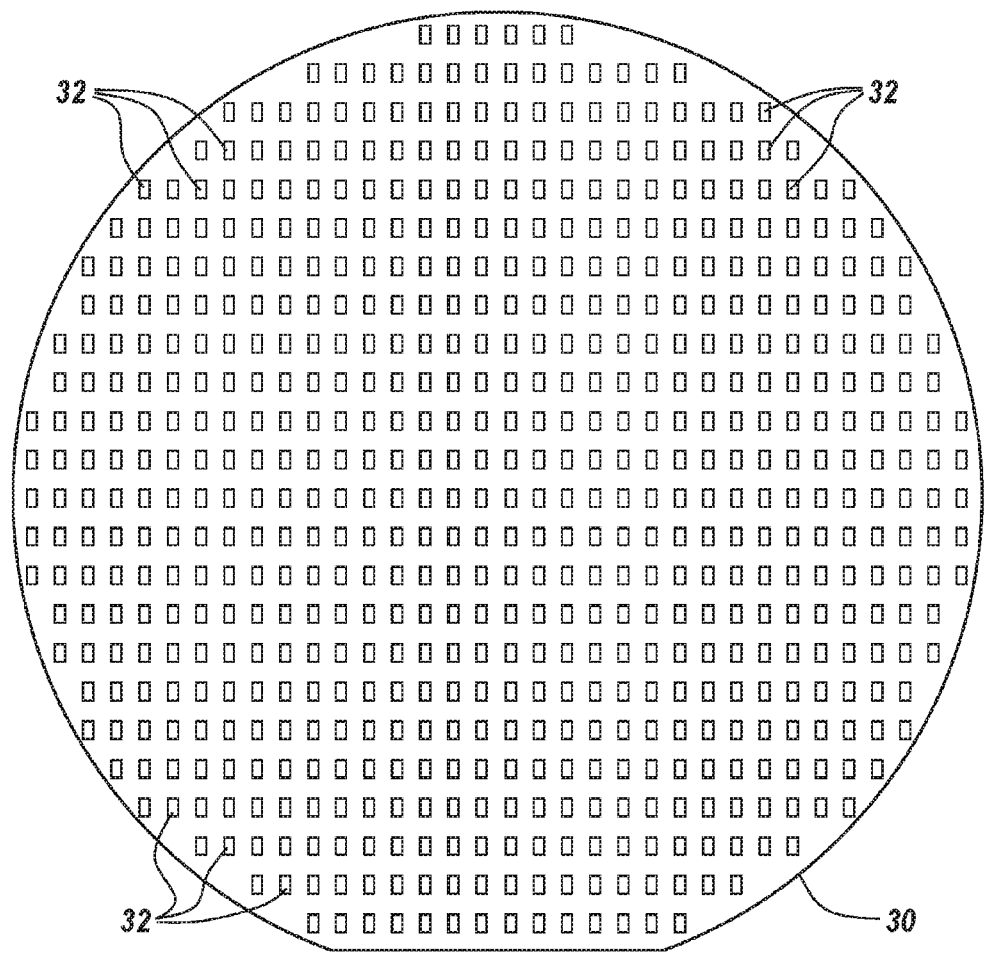
FIG. 3A is a plan view of a wafer-scale quartz blank holder, according to an embodiment of the present invention.
Figure 3B:
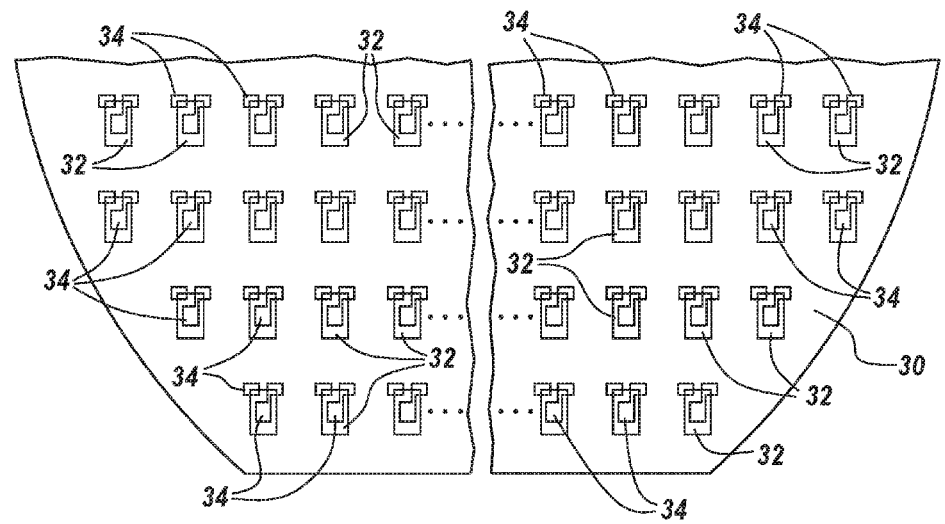
FIG. 3B is a top-down view of a bottom electrode shadow mask mounted underneath the quartz blank holder of FIG. 3A.
Figure 3C:
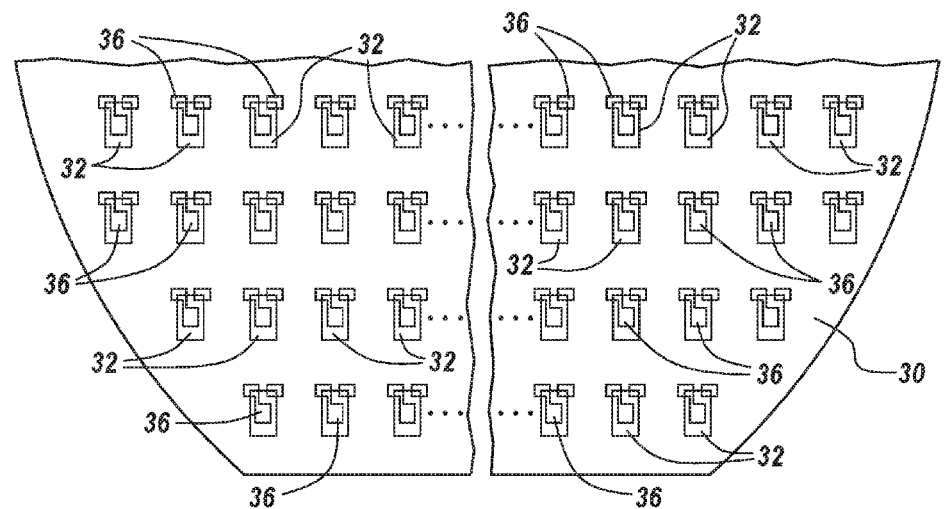
FIG. 3C is a top-down view of a top electrode shadow mask mounted to the quartz blank holder of FIG. 3A.
Figure 3D:
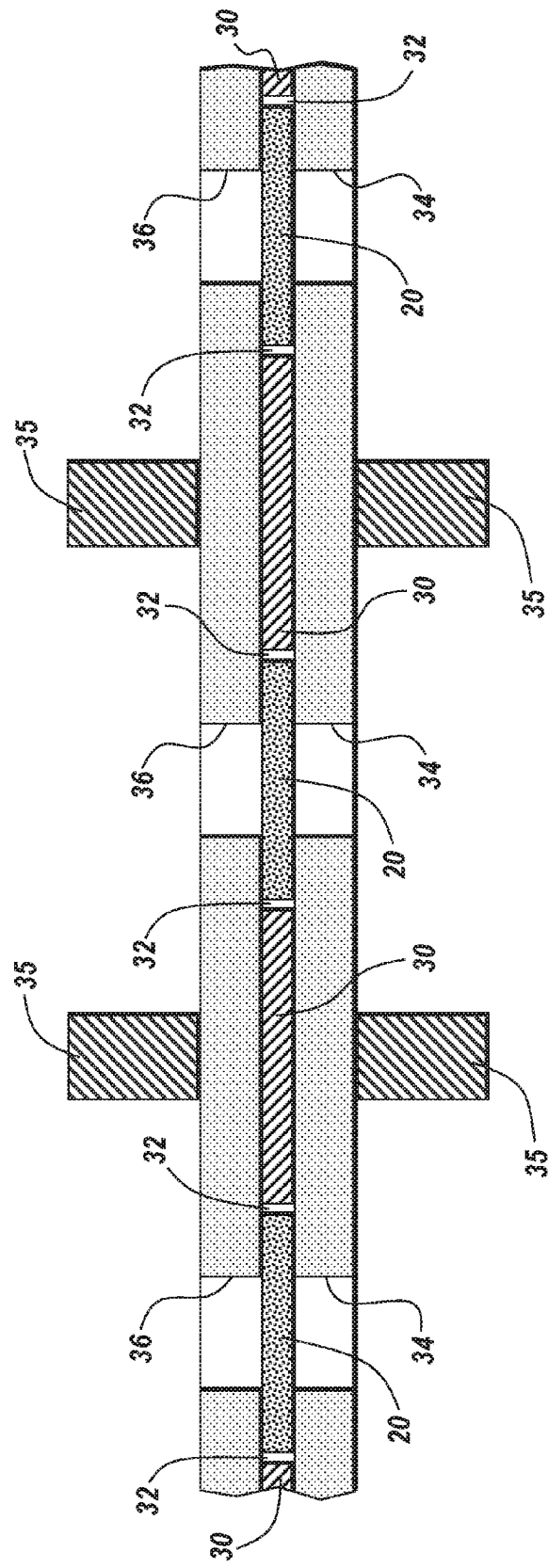
FIG. 3D is a cross-sectional view of a portion of the double-sided shadow mask having a quartz blank holder nested therein.

FIG. 3A illustrates a wafer-scale quartz blank holder 30 having a two-dimensional array of rectangular-shaped openings 32 therein, which have sufficient size to retain quartz crystal blanks therein, as illustrated by FIG. 3D. FIG. 3B is a bottom-up view of a bottom electrode shadow mask mounted to the quartz blank holder of FIG. 3A. This bottom electrode shadow mask includes patterned openings 34 therein that are aligned to each opening 32 within the blank holder 30 and support formation of bottom electrodes on quartz blanks held within the openings 32. In particular, the patterned openings 34 are sufficiently large that they extend outside the dimensions of the openings 32 in the blank holder 30. Accordingly, during bottom electrode deposition, which may be performed at an offset angle relative to normal, the metallization applied to the bottom of the quartz blanks 20 will wrap around the beveled/curved edges of the blanks 20 and support full bottom-to-top wrap-around of the electrically conductive contact cement. FIG. 3C is a top-down view of a top electrode shadow mask mounted to the quartz blank holder of FIG. 3A. This top electrode shadow mask includes patterned openings 36 therein that are aligned to each opening 32 within the blank holder 30 and support formation of top electrodes (and top/bottom electrode contacts) on quartz blanks held within the openings 32. In particular, the patterned openings 36 are sufficiently large that they extend outside the dimensions of the openings 32 in the blank holder 30. Accordingly, during top electrode deposition, which may be performed at an offset angle relative to normal, the metallization applied to the top of the quartz blanks 20 will wrap around the beveled/curved edges of the blanks 20. FIG. 3D illustrates a cross-sectional view of a portion of the double-sided shadow mask of FIGS. 3A-3C having a quartz blank holder 30 nested therein. According to some embodiments of the invention, the quartz blank holder 30 may be permanently mounted to one of the top and bottom shadow masks, but the top and bottom shadow masks may be held in a fixed position relation relative to each other using an array of magnets 35, which operate to hold at least one shadow masks against the quartz blank holder 30 when populated with quartz blanks 20.

Figure 4A:
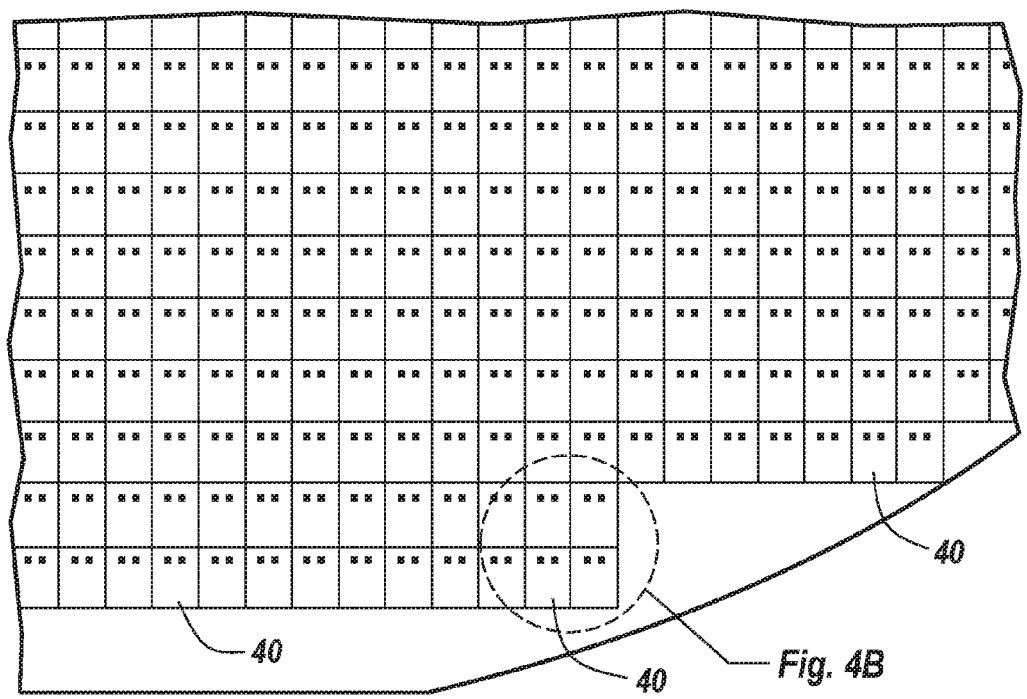
FIG. 4A is a plan view of a portion of an integrated circuit wafer having a two-dimensional array of oscillator circuits therein, which include respective pairs of electrode adhesion bumps on a surface thereof.
Figure 4B:
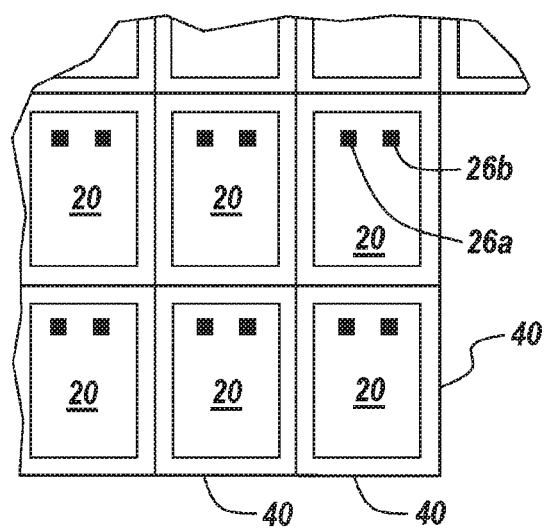
FIG. 4B is an enlarged view of a portion of the integrated circuit wafer of FIG. 4A, after crystal resonator blanks have been mounted thereon.

Referring now to FIGS. 4A-4B, an integrated circuit wafer having a two-dimensional array of oscillator circuits 40 therein is illustrated as including respective pairs of electrode adhesion bumps 26a, 26b (e.g., electrically conductive cement) on a surface thereof. These adhesion bumps 26a, 26b may be formed as described hereinabove with respect to Block 114 in FIG. 1A. FIG. 4B is an enlarged view of a portion of the integrated circuit wafer of FIG. 4A, after crystal resonator blanks 20 have been mounted thereon as disclosed above with respect to Blocks 116-120 in FIG. 1A. In particular, as shown by FIGS. 4C-4D, the electrode adhesion bumps 26a, 26b may be configured to provide electrical contact to the top and bottom electrodes (22, 24a-24b) associated with each resonator blank 20 and support each resonator blank 20 at a fixed distance above a surface of an underlying oscillator circuit 40 (e.g., above a surface of a passivation layer overlying an oscillator circuit embedded within a silicon substrate).

Figure 4C:
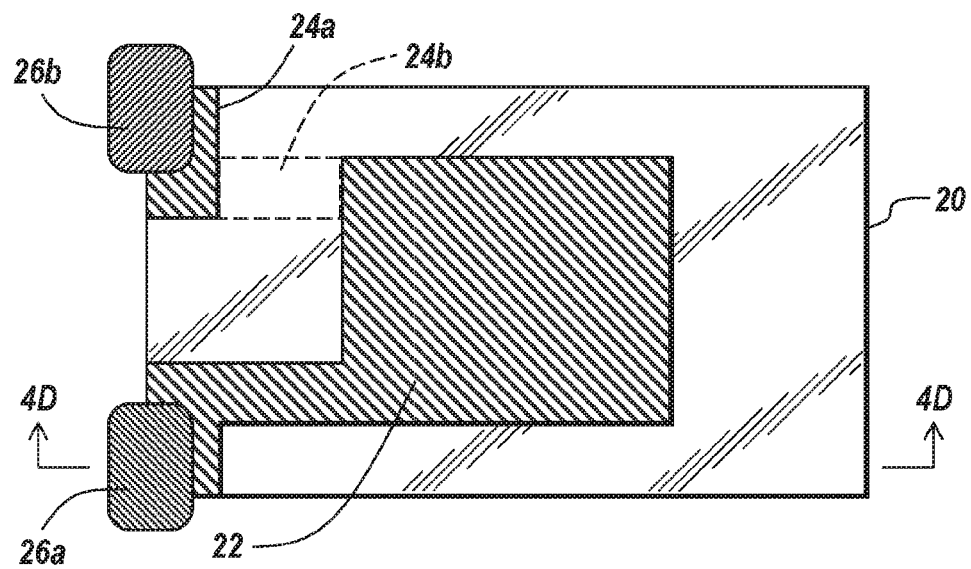
FIG. 4C is a plan view of crystal resonator blank of FIG. 4B.
Figure 4D:
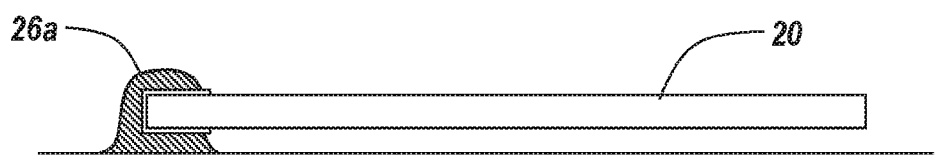
FIG. 4D is a cross-sectional view of the crystal resonator blank of FIG. 4C, taken along line 4D-4D'.
Figure 4E:
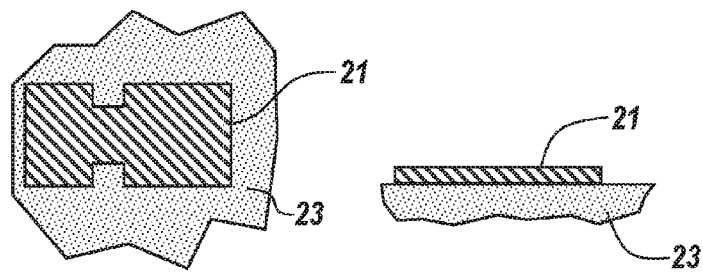
FIGS. 4E-4H are cross-sectional views of a portion of a crystal resonator blank, which illustrate a crystal oscillator fabrication method according to an embodiment of the invention.
Figure 4F:
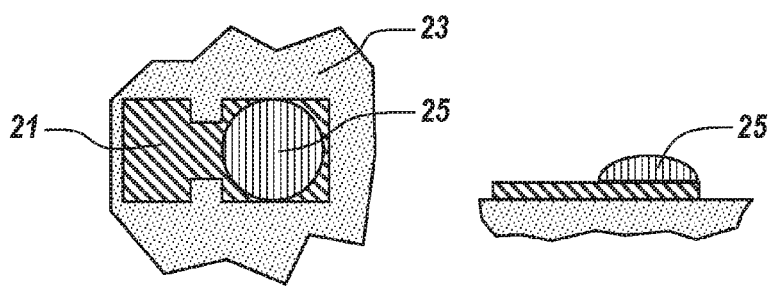
Figure 4G:
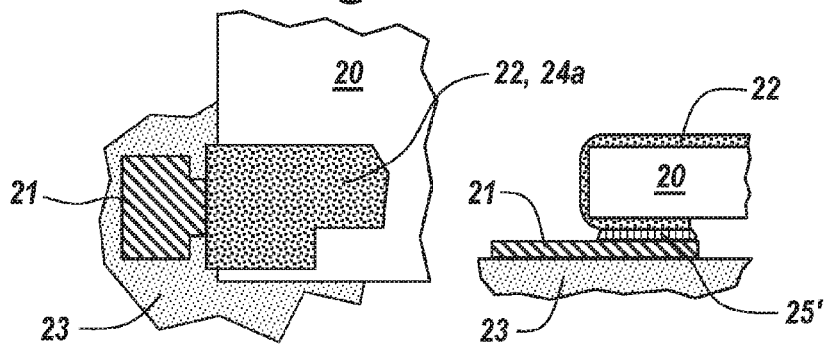
Figure 4H:
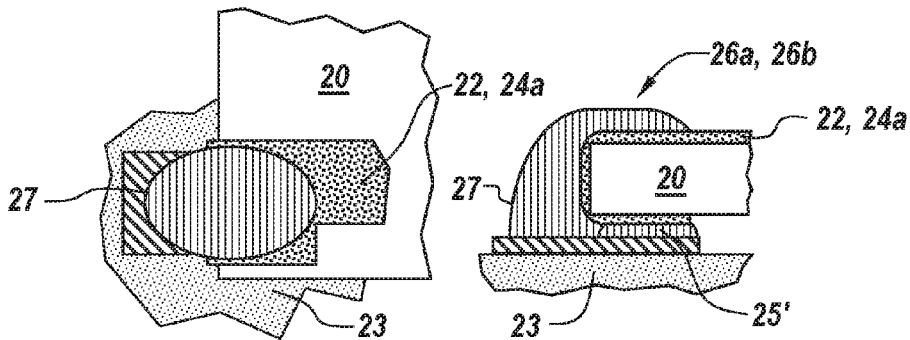

Now, as shown by FIGS. 4E-4H, the electrode adhesion bumps 26a, 26b of FIGS. 4C-4D may be formed and bonded to a resonator blank 20 having top and bottom electrodes (22, 24a-24b) thereon. Using the formation methods described herein, resonator blanks 20 having side surfaces that are flat, as opposed to contoured or beveled, may be securely bonded to a substrate with sufficiently high long term reliability to sustain repeated expansion/contraction responsive to temperature changes. In particular, FIG. 4E illustrates a first/second dumbbell-shaped mounting pad 21 (e.g., metal pad) having a constricted neck region intermediate first and second opposing ends thereof, on an underlying substrate 23 (e.g., integrated circuit substrate, package cap/base, etc.). As shown by FIG. 4F, electrically conductive mounting cement may be deposited onto one end of the mounting pad 21 to thereby define a first/second electrode adhesion bump 25 thereon. Thereafter, as shown by FIG. 4G, a top electrode 22 of the crystal oscillator is electrically connected to a first mounting pad 21 by contacting a wraparound extension of the top electrode 22, which is located on a bottom surface of the resonator blank 20, to a first adhesion bump 25'. Similarly, according to FIG. 4G, a bottom electrode 24b of the crystal oscillator is electrically connected to a second mounting pad 21 by contacting the bottom electrode 24b to a second adhesion bump 25'. The first and second electrode adhesion bumps 25' are then cured using conventional curing techniques.

Following this initial curing, additional electrically conductive mounting cement is deposited onto the top electrode 22, the exposed end of the first mounting pad 21 and an exposed portion of the first electrode adhesion bump 25' to thereby define a top electrode adhesion extension 27. In addition, electrically conductive mounting cement is deposited onto a wraparound extension of the bottom electrode 24a (on the top surface of the crystal blank 20), the exposed end of the second mounting pad 21 and an exposed portion of the second electrode adhesion bump 25' to thereby define a corresponding bottom electrode adhesion extension 27. These electrode adhesion extensions 27 are then cured to complete the fabrication of dual-cured electrode adhesion bumps 26a, 26b, which mechanically secure and electrically short the top electrode 22 to the first mounting pad 21 and the bottom electrode 24a, 24b to the second mounting pad 21.

Figure 5A:
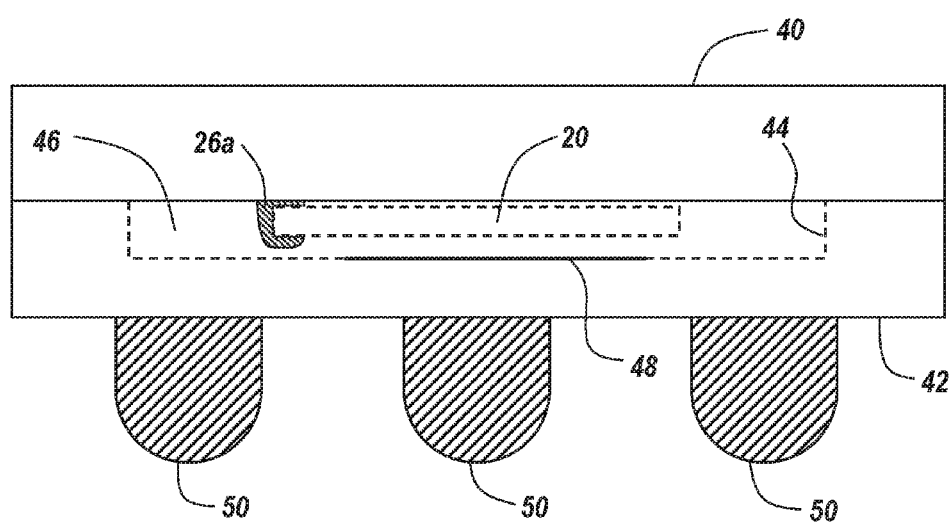
FIG. 5A is a cross-sectional view of packaged crystal-based oscillator circuit, according to embodiments of the invention.
Figure 5B:
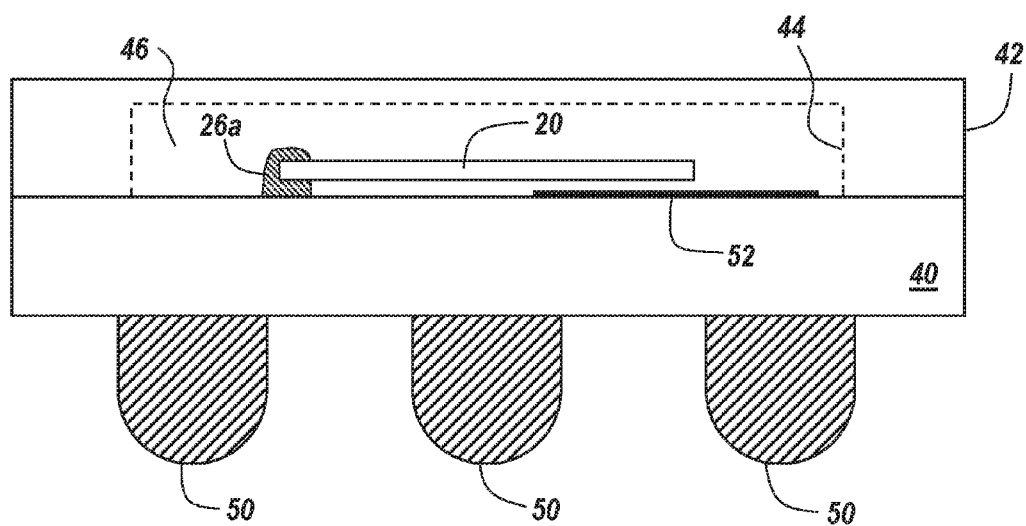
FIG. 5B is a cross-sectional view of packaged crystal-based oscillator circuit with built-in inductor, according to embodiments of the invention.

FIGS. 5A-5B illustrate packaged crystal-based oscillator circuits, which may be finalized as described hereinabove with respect to FIG. 1C and possibly using one or more steps described in U.S. Patent of U.S. Pat. No. 7,955,885 to Bhugra et al., the disclosure of which is hereby incorporated herein by reference. As illustrated, the packaged oscillator circuit includes an integrated circuit substrate 40 (e.g., silicon die), which has oscillator circuitry therein, and a cap 42 (e.g., silicon cap), which is hermetically bonded to the substrate 40 (e.g., using a eutectic alloy). As described above, each singulated cap 42 includes a recess 44 and cavity 46 therein, which houses a resonator blank 20. This resonator blank 20 is mounted and electrically connected to the underlying substrate 40 by the electrically conductive adhesion bumps 26a, 26b. Electrically conductive through-cap vias (not shown) electrically connect solder bumps 50 to corresponding pads on the substrate 40 in the embodiment of FIG. 5A. In FIG. 5B, the solder bumps 50 are directly connected to the substrate 40.

As further shown by FIG. 5A, the recess 44 within the cap 42 may also include a deposited material layer 48, which can be partially transferred to the resonator blank 20 (as mass loading) during an electrical trimming operation. This electrical trimming operation may be performed before and/or after the singulation of the packaged integrated circuit wafer. According to additional embodiments of the invention, the material layer 48 may be an electrically conductive layer that is formed by removing electrode material from the resonator blank 20 during electrical trimming. In contrast, FIG. 5B illustrates the presence of an inductor 52 on a surface of the substrate 40. As shown, at least a portion of this inductor 52 (e.g., spiral inductor) may be disposed between the resonator blank 20 and the substrate 40. In particular, the inductor 52 may be disposed on an upper passivation layer, which covers the substrate 40. According to some embodiments of the invention, this passivation layer may contain a magnetically reflective layer (e.g., M1 metal layer) that inhibits a reduction in inductor Q caused by the underlying "lossy" substrate.

Figure 6A:
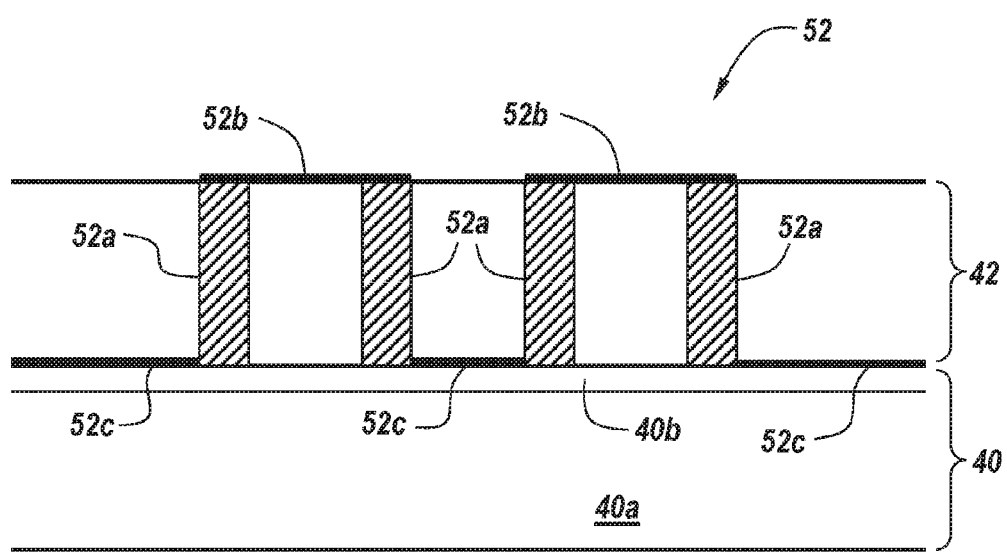
FIG. 6A illustrates a cross-section of an inductor formed in a cap of a packaged oscillator circuit, according to an embodiment of the present invention.

Referring now to FIG. 6A, an inductor 52 may be configured with vertical through-cap vias 52a (TCVs) and planar segments 52b, 52c that are serially connected together, with segments 52b extending on an outside top surface of a cap 42 of a packaged oscillator circuit and segments 52c extending between a bottom surface of the cap 42 and underlying IC passivation layers 40b, which extend on an uppermost surface (e.g., active circuit surface) of an underlying integrated circuit chip 40a within an integrated circuit substrate 40. A centermost bottom segment 52c may be utilized as a center-tap (CT) of the inductor 52 in some embodiments of the invention.

Figure 6B:
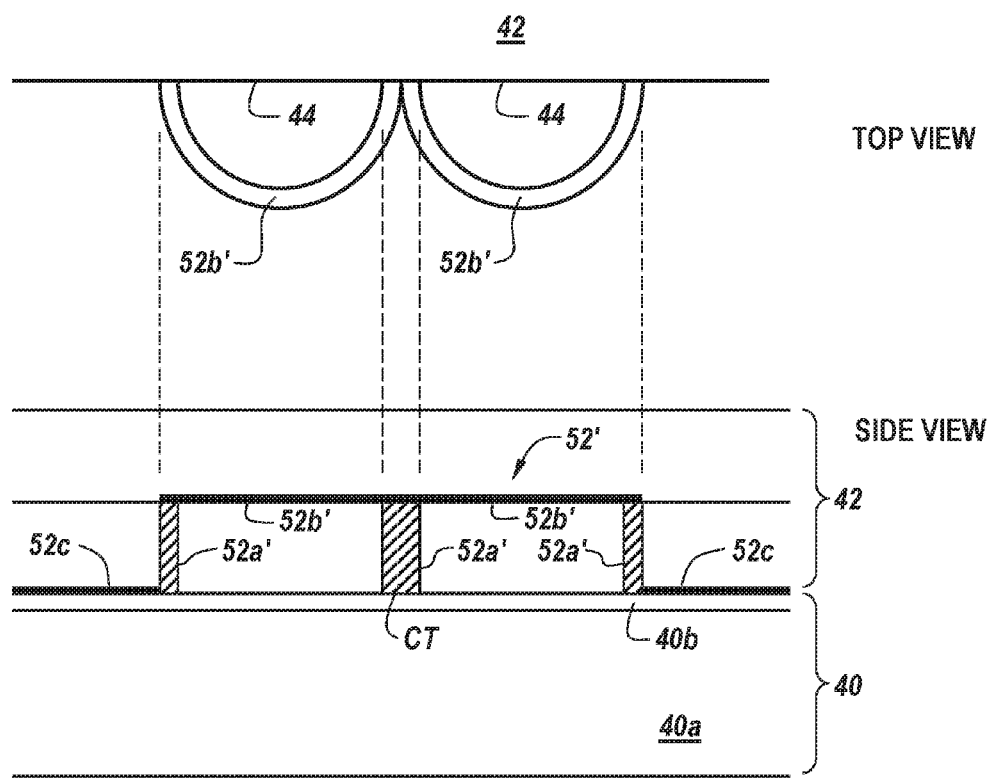
FIG. 6B illustrates a cross-section of an inductor patterned along a sidewall and top surface of a cavity within a packaged oscillator circuit, according to an embodiment of the present invention.

In contrast, the inductor 52' of FIG. 6B replaces the TCVs 52a of FIG. 6A with inductor segments 52a', 52b', which are patterned on a sidewall and top inner surface of a recess 44 within the cap 42, respectively. As shown, the segments 52b' are arcuate-shaped (e.g., circular) inductor segments that are joined at a center tap (CT) of the inductor 52' and the outermost sidewall segments 52a' are electrically connected to lateral segments 52c, which extend between a bottom surface of the cap 42 and the underlying IC passivation layers 40b.

Figure 7:
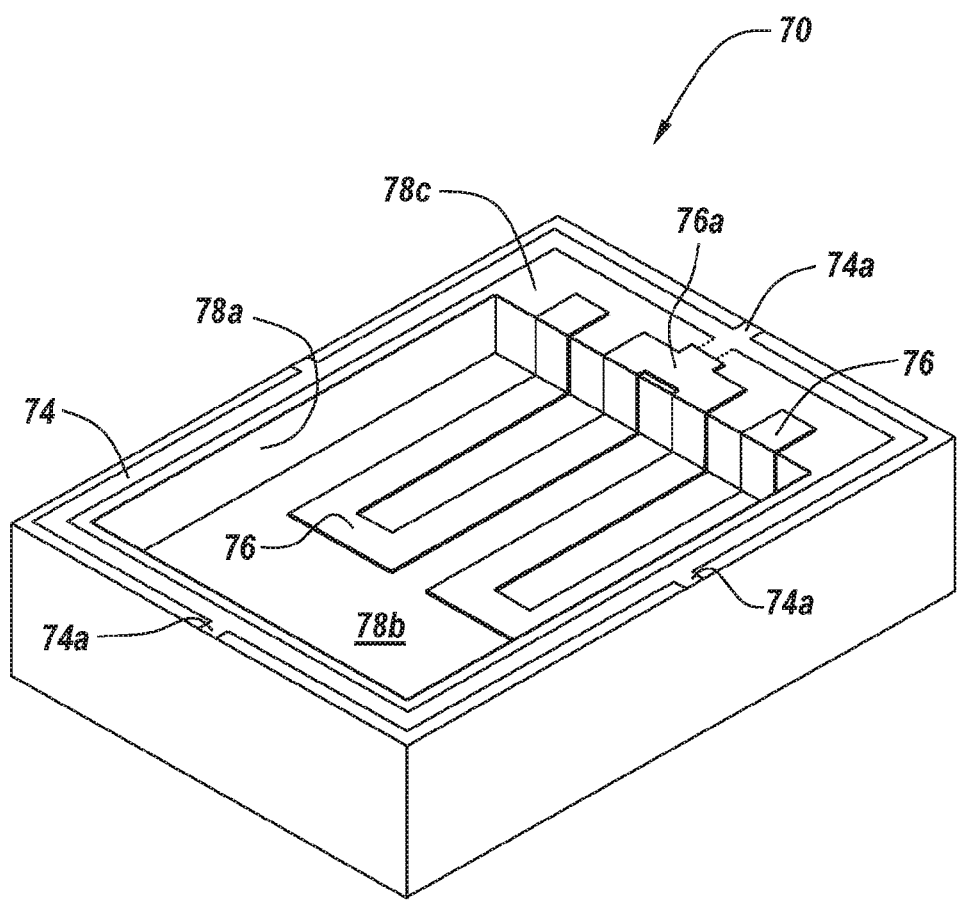
FIG. 7 is a three-dimensional perspective view of an electrically insulating cap having a recess therein containing a patterned inductor, according to an embodiment of the invention.

Referring now to FIG. 7, a three-dimensional perspective view of an electrically insulating cap 70 (e.g., glass cap) is illustrated as including a recess therein having a plurality of sidewalls 78a, an interior top surface 78b within the recess and a primary/bonding surface 78c containing a metal seal ring 74 with tie bar extensions 74a on each side thereof. As shown, a center-tap inductor 76 is patterned to extend on each of the interior top surface 78b, sidewall 78a and bonding surface 78c. In some embodiments of the invention, the inductor 76 may include a pair of arcuate-shaped segments, which may be mirror-images of each other about a center tap. Preferably, these arcuate-shaped segments have rounded corners and may even be semicircular-shaped. In additional embodiments of the invention, a center tap 76a of the inductor 76 may be provided, which is electrically connected to the metal seal ring 74. This metal seal ring 74 may be held at a fixed potential (e.g., GND) during operation of a packaged integrated circuit. According to additional embodiments of the invention, the cap 70 may include a magnetic material therein, which increases an effective inductance of the inductor 76 relative to an otherwise equivalent cap and inductor combination that is devoid of the magnetic material, such as a ferrous-type material or a magnetic rare-earth material.

According to still further embodiments of the invention, methods of forming the electrically insulating cap 70 of FIG. 7 may utilize wafer-scale fabrication techniques, which can include providing a glass plate having a two-dimensional array of recesses (78a, 78b) therein and then plating a relatively thin electrically conductive material (e.g., copper (Cu)) and possibly an adhesion layer using an electroless plating bath, for example. Alternatively, this plating step, if used, may be selective to the non-recess side of the glass plate/wafer. The shape of the center-tap inductor 76 within each of the recesses may be defined by performing deep resolution photoresist and patterning steps on the electrically conductive material. To achieve a desired inductor performance, an electroplating step may be performed to selectively thicken the inductor pattern, using tie bars and seal rings (74, 74a) to provide a necessary electrical connection between all recesses on the plate. In some embodiments of the invention, this electroplating step may utilize a combination of copper (Cu) followed by a low temperature eutectic solder (e.g., AuSn) to enable sealing of the seal rings 74 to a similarly patterned connection material in an underlying integrated circuit wafer, prior to dicing.

Referring now to FIGS. 8A-8B and 9A-9E, a two-piece package 80, which is configured to be electrically coupled (e.g., solder bonded) to an underlying integrated circuit substrate 100, is illustrated as including a hermetically sealed cavity 82 therein and a crystal resonator 84 within the cavity 82. The package is shown as including a cap 86 and a base 88, which has a recess 99 therein. The cap 86 and base 88 are preferably formed of a material selected from a group consisting of glass and ceramics. For example, a photo-convertible glass, such as APEX® glass, manufactured by 3D Glass Solutions, or a photo structurable glass ceramic (PSGC), such as Foturan®, manufactured by Schott Glass Corp and distributed by Invenios®, may be used. In particular, Foturan® is a lithium-potassium glass with small amounts of silver (Ag) and cerium oxide particles distributed therein. When this glass is exposed through a mask to ultraviolet light at a wavelength between 290-330 nm and then heated up to 600° C., a crystallic structure is formed in the illuminated regions. Foturan® may be anisotropically etched to achieve relatively high aspect ratio patterns/holes using an hydrofluoric acid (HF) solution, with the crystallized regions having an etch rate of up to about 20 times higher than the non-crystallized (i.e., vitreous) regions.

Figure 8A:
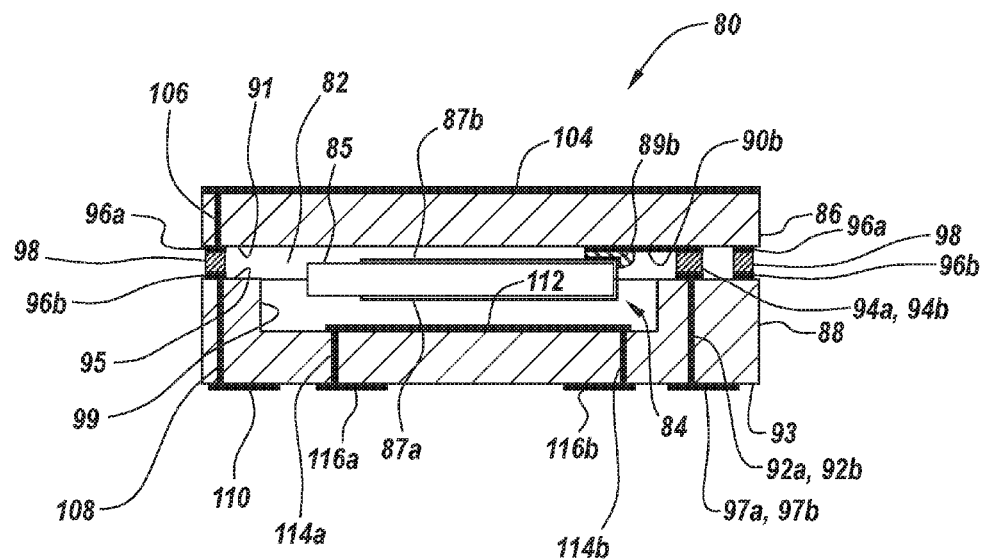
FIG. 8A is a cross-sectional view of a packaged crystal resonator and inductor, according to an embodiment of the invention.

The crystal resonator 84 is illustrated as including a crystal blank 85, which may have flat sides, a top electrode 87a primarily on a top surface of the crystal blank 85 and a bottom electrode 87b primarily on a bottom surface of the crystal blank 85. As shown by FIGS. 8A and 9B-9C, each of the top and bottom electrodes 87a-87b may be bonded by a pair of electrically conductive adhesion bumps 89a, 89b to a corresponding pair of electrically conductive traces 90a, 90b, which are formed on a bottom surface 91 of the cap 86 using, for example, metal deposition and patterning techniques. According to some embodiments of the invention, metallization processes may include the use of Ti/W adhesion layers with Cu thereon (as the primary metal). A composite metallization coating of Ni (as a barrier layer) and Au for high solderability and to inhibit oxidation may also be used in some embodiments of the invention.

These top and bottom electrodes 87*a*, 87*b* are electrically connected to a pair of contact pads 102 on the underlying integrated circuit substrate 100 by a corresponding pair of electrically conductive traces 90*a*, 90*b* and a corresponding pair of electrically conductive vias 92*a*, 92*b* (e.g., copper vias with Ti/W adhesion layers), which extend through the base 88 to corresponding contact pads 97*a*, 97*b* (e.g., I/O pads) on a bottom surface 93 of the base 88. As illustrated best by FIG. 8A, the pair of electrically conductive vias 92*a*, 92*b* in the base 88 are electrically connected to the pair of electrical traces 90*a*, 90*b* by a pair of electrically conductive solder connectors 94*a*, 94*b*, which extend between the cap 86 and base 88, within the cavity 82.

As illustrated best by FIGS. 8A, 9B-9C and 9E, a perimeter of the cavity 82 is defined by a pair of opposing top and bottom electrically conductive seal rings 96*a*, 96*b* on a bottom surface 91 of the cap 86 and an upper surface 95 of the base 88, respectively. According to some embodiments of the invention, the top and bottom electrically conductive seal rings 96*a*, 96*b* are sealed together by a frame-shaped solder seal ring 98, which is shown as having a rectangular shape around a perimeter of the cavity 82. As will be understood by those skilled in the art, the solder connectors 94*a*, 94*b* and solder seal ring 98 may be formed using a Au/Sn composite.

Referring now to FIGS. 8A, 9A and 9C-9E, an electrically conductive ground shield 104 (e.g., metal shield) is provided to cover at least a majority of a top surface of the cap 86, and an electrically conductive ground shield via 106 is provided, which extends through the cap 86 and electrically connects the ground shield 104 to the frame-shaped solder seal ring 98 and the top and bottom seal rings 96*a*, 96*b*. Typically, the base 88 may also include an electrically conductive ground via 108 therein, which electrically connects the frame-shaped solder seal ring 98 to a ground contact pad 110 on a bottom surface 93 of the base 88 and an electrical trace 102 (e.g., contact pad) on the underlying integrated circuit substrate 100, via a solder bond 112 extending therebetween. As shown by FIG. 9D, a plurality of contact pads (e.g., 5 contact pads) on a bottom surface 93 of the base 88 may be used to facilitate electrical contact to the underlying integrated circuit substrate 100.

As further shown by FIGS. 8A and 9D-9E, an inductor 112 may be provided within the recess 99 in the base 88 of the package 80 and first and second terminals 112*a*, 112*b* of the inductor 112 may be electrically connected by through-base vias 114*a*, 114*b* to corresponding inductor contact pads 116*a*, 116*b* on a bottom surface 93 of the base 88. Although the inductor 112 of FIG. 9E is illustrated as being horseshoe-shaped, inductors having many other shapes and configurations may also be provided. For example, according to other embodiments of the invention, the inductor may be a three-terminal center-tapped serpentine-shaped inductor or a two-terminal spiral-shaped inductor.

Figure 10:
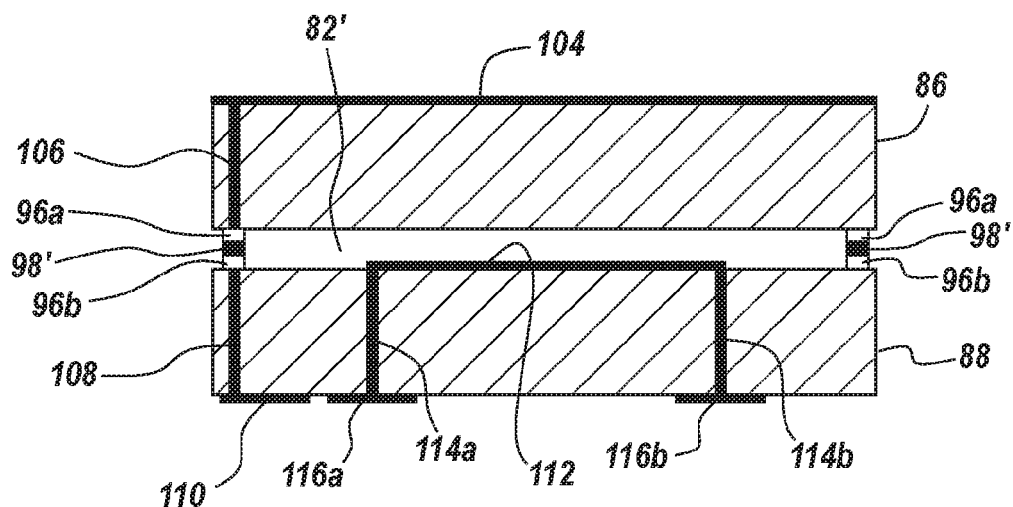
FIG. 10 is a cross-sectional illustration of a packaged inductor with top-surface ground shield, which uses a polymer seal, according to an embodiment of the invention.
Figure 11A:
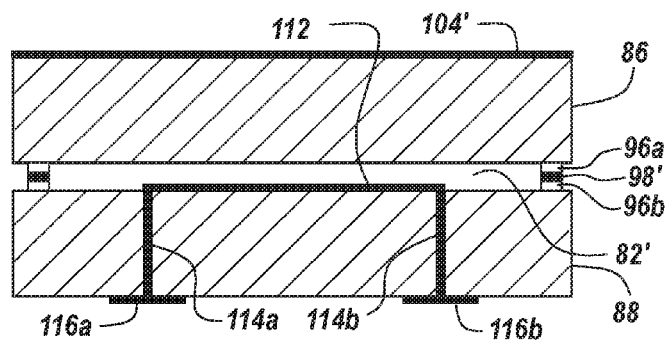
FIG. 11A is a cross-sectional illustration of a packaged inductor with electrically floating top-surface shield, which uses a polymer seal, according to an embodiment of the invention.

Referring now to FIG. 10, a packaged inductor 112 with top-surface ground shield 104 (optional) is illustrated as including a polymer frame-shaped seal 98', which bonds top and bottom seal rings 96*a*, 96*b* together to thereby define a reduced-volume cavity 82' between a cap 86 and a base 88 of the package. Typical electrically conductive polymer materials include, but are not limited to, cyanate ester polymers, such as Ablebond JM7000™. As highlighted by the common reference numerals from FIGS. 8A-8B and 9A-9E, this embodiment of the packaged inductor 112 of FIG. 10 is similar to the packaged device of FIG. 8A with the crystal resonator 84 removed, recess 99 omitted and solder seal 98 replaced by the polymer seal 98'. Moreover, according to further embodiments of the invention, the crystal resonator 84 of FIG. 8A may be replaced by a second inductor, which is plated on a bottom surface of the cap 86, to thereby yield a dual-inductor package. With sufficient mutual inductance therebetween, the pair of inductors within a dual-inductor package may be utilized as a packaged micro-transformer. The packaged inductor 112 of FIG. 11A is similar to the packaged inductor 112 of FIG. 10, with the top-surface ground shield 104 replaced by a top-surface electrically floating shield 104'. The packaged inductor 112 of FIG. 11B is similar to the packaged inductor 112 of FIG. 10, with the top-surface ground shield 104 replaced by a cavity ground shield 104" within the cavity 82'.

Figure 11B:
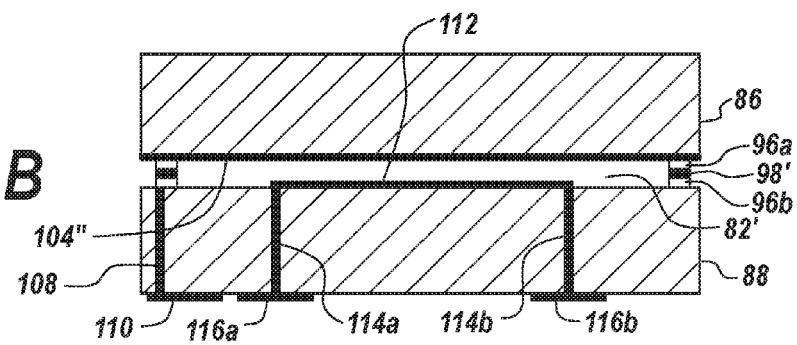
FIG. 11B is a cross-sectional illustration of a packaged inductor with cavity ground shield, which uses a polymer seal, according to an embodiment of the invention.
Figure 11C:
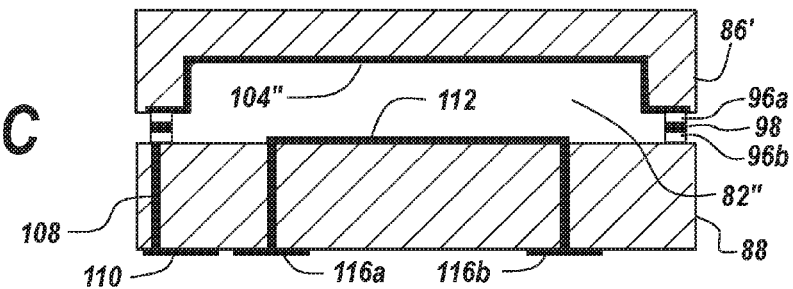
FIG. 11C is a cross-sectional illustration of a hermetically-sealed packaged inductor with cavity ground shield within a cap recess, according to an embodiment of the invention.
Figure 11D:
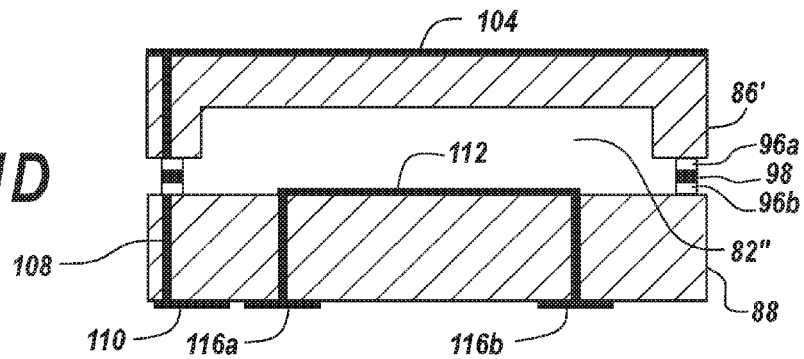
FIG. 11D is a cross-sectional illustration of a hermetically-sealed packaged inductor with planar top-surface ground shield, according to an embodiment of the invention.

According to additional embodiments of the invention, the cavity ground shield 104" of FIG. 11B may be formed in a recess in the cap 86' and the polymer seal 98' may be replaced with a solder seal 98 to thereby define a hermetically-sealed cavity 82", as illustrated by FIG. 11C. Finally, the polymer seal 98' and reduced-volume cavity 82' of FIG. 10 may be replaced by a hermetically-sealed larger volume cavity 82", as shown by FIG. 11D.

As will now be further highlighted with respect to FIGS. 13-15, additional embodiments of the invention can include the combination of multiple resonators, which are physically coupled together and oriented in a single package such that a force of acceleration (e.g., vibration) on a response of one resonator is at least substantially cancelled by an opposite response from the other resonator receiving the same force. In this manner, an oscillator circuit containing the multiple resonators can have characteristics that are substantially vibration free. As will be understood by those skilled in the art, quartz is a traditional frequency generating technology, however, MEMs, FBAR, SAW and BAW resonators all exhibit some degree of degradation of phase noise under vibration or material stress and therefore can be included in these embodiments. The challenge, of course, is to have the resonators be very similar in performance in all common specifications and then advantageously use physical orientation as the differentiator. To accomplish this goal, the resonators may need to originate in very close proximity within the same raw material, leaving orientation the determining factor in performance characteristics. Modifying classical production techniques to accomplish this commonality of specification can be challenging. However, more advanced photolithographic processes can be used to simplify the commonality of specification and proximity within raw material and thereby leave orientation as a single dominant parameter to test before final assembly. Programmable circuitry may also be used to further tune process tolerances and improve phase noise characteristics.

Embodiments of the invention that support the independence of multiple resonators can also support the use of different technologies, materials, thicknesses, etc., so that the resulting combinations can have unique properties unachievable with a monolithic solution and are hereby included. Nonetheless, monolithic solutions including multiple resonators on a single common substrate can be utilized to require fewer assembly steps and lower manufacturing costs. Moreover, instead of adding positive capacitive impedance for the purposes of nulling any residual acceleration vector, which has the detrimental effect of increasing the effective shunt capacitance of a resonator, embodiments of the invention described and illustrated hereinbelow can utilize a negative capacitive impedance generated by a negative impedance converter (NIC) to more efficiently null any residual acceleration vector. In addition, if a composite structure containing multiple resonators is implemented in an oscillator, the lowered shunt capacitance will typically mean less static power consumption is required to sustain oscillation.

When two or more resonators are arranged in series, the quality of resonance (Q) of the composite resonator typically increases and this increase can be further enhanced when a shunt capacitance of one or more of the resonators is cancelled using an active circuit(s). Many resonators can also sustain higher order modes. For example, quartz-based resonators can typically support overtone modes occurring at roughly odd integer multiples of a fundamental (or lowest) resonant frequency and the intrinsic Q of a quartz resonator operated at an overtone can be higher than a fundamental resonator at the same frequency. In fact, it would not be unusual for a third overtone 50 MHz crystal resonator to have twice the Q of a fundamental 50 MHz crystal resonator, which means a series composite of both could have a composite Q between twice and three times the Q of a single fundamental 50 MHz crystal. As described more fully hereinbelow, the use of a negative impedance converter (NIC) can also make it easier to maximize the composite Q even in the presence of individual resonators with substantially different natural resonant frequencies.

As will be understood by those skilled in the art, a conventional oscillator circuit that uses a third overtone resonator often has to include additional "trap" circuitry to prevent the third overtone resonator from oscillating at its fundamental frequency. This is because the resistance of the third overtone resonator is often less at the fundamental frequency and the gain of an oscillator amplifier also tends to be higher (or at least not lower) at the fundamental frequency than at the third overtone frequency. Unfortunately, conventional trap circuitry can require the use of relatively large value inductors and capacitors, which may not be suitable for low cost integration on a semiconductor chip. Nonetheless, as shown more fully in FIG. 13D, if one of the resonators in a composite series resonator structure is a fundamental resonator, then it can operate both as a Q enhancement device and as a trap circuit.

Figure 12A:
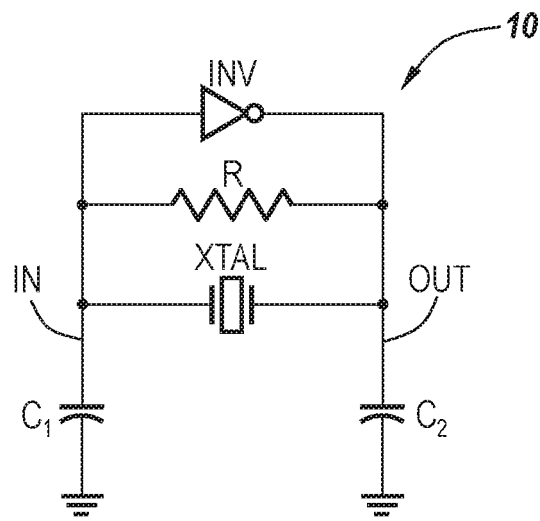
FIG. 12A is an electrical schematic of a Pierce-type oscillator according to the prior art.
Figure 12B:
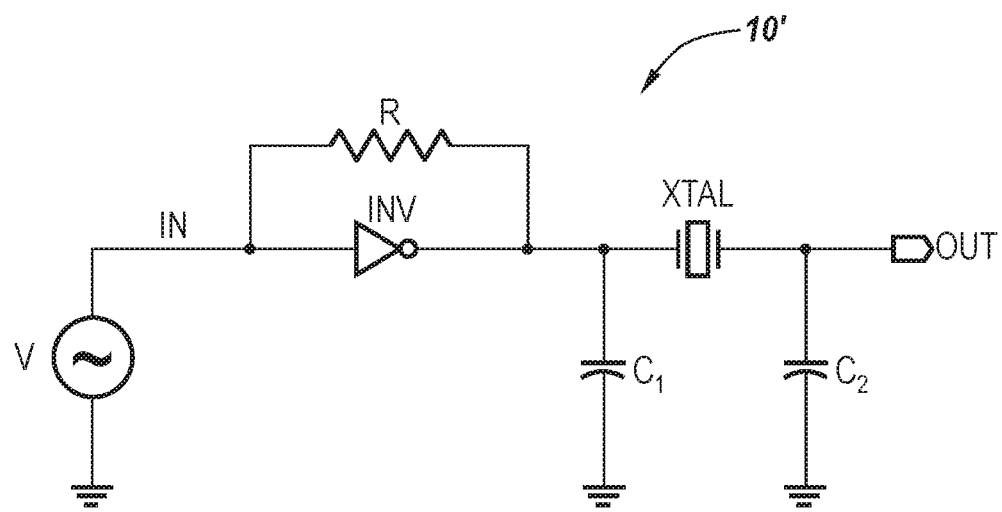
FIG. 12B is an electrical schematic of an open-loop approximation of the Pierce-type oscillator of FIG. 12A, according to the prior art.

Referring now to FIG. 12A, a quartz-type resonator may be utilized within a conventional oscillator 10 known as a Pierce-type oscillator, which can be implemented with a relatively minimum number of components including an inverter INV, a resistor R, two capacitors $C_1$ and $C_2$ and a quartz crystal XTAL, which acts as a highly selective filter element. An open-loop approximation 10' of the Pierce-type oscillator 10 is illustrated by FIG. 12B. As will be understood by those skilled in the art, the resistor R acts as a feedback resistor, which biases the inverter in its linear region of operation and effectively causes it to function as a high gain inverting amplifier. The combination of the quartz crystal and the two capacitors $C_1$ and $C_2$ operates as a pi network band pass filter. This filter provides a phase shift of 180° and a voltage gain from the output to input at approximately the resonant frequency of the crystal. The combination of the 180° phase shift from the pi network and the negative gain from the inverter results in a positive loop gain, making the bias point set by R unstable and leading to oscillation.

Figure 12C:
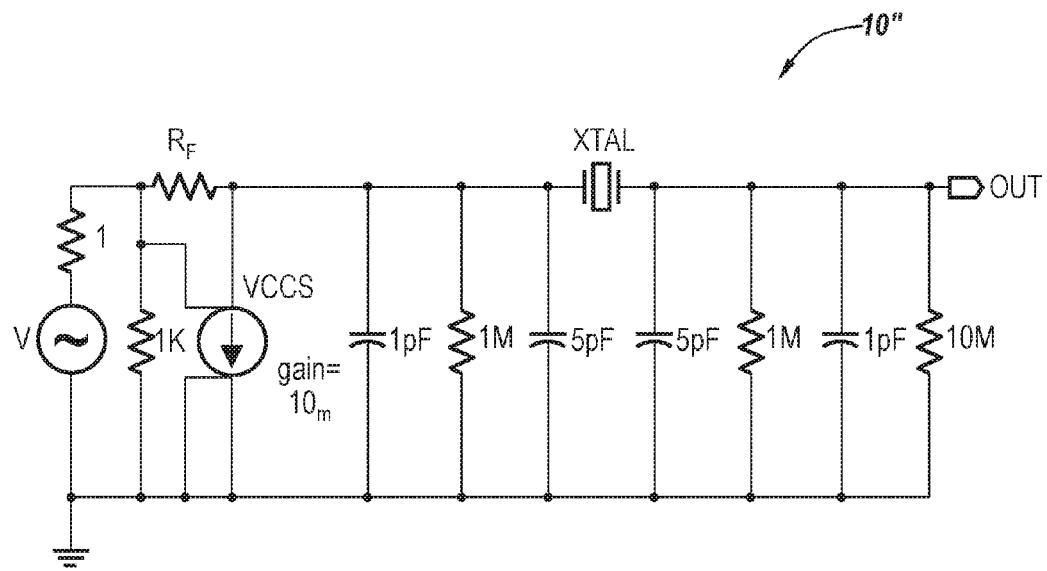
FIG. 12C is an electrical schematic of a detailed open-loop approximation of the Pierce-type oscillator of FIG. 12A with some conversions to ideal components to support AC analysis.
Figure 12D:
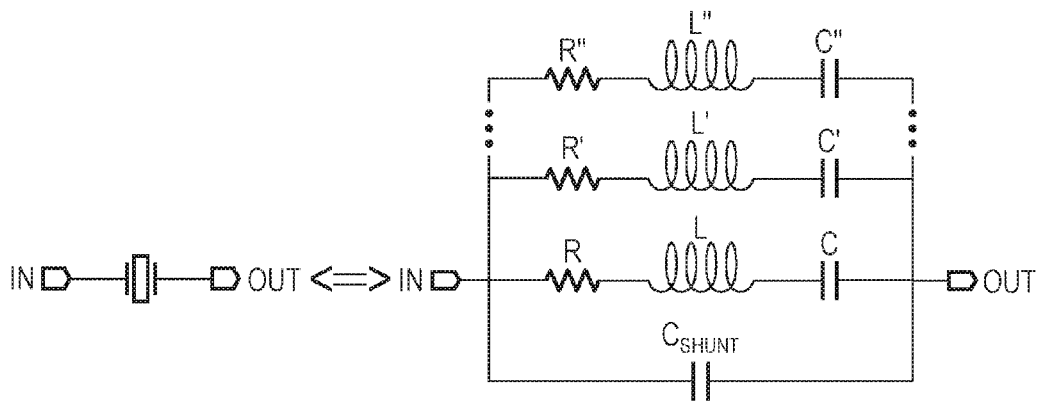
FIG. 12D illustrates a Butterworth-Van Dyke (BVD) model of a single crystal resonator containing a plurality of series R-L-C circuits of "motional parameters" in parallel with each other and in parallel with a shunt capacitor ($C_{SHUNT}$), according to the prior art.
Figure 12E:
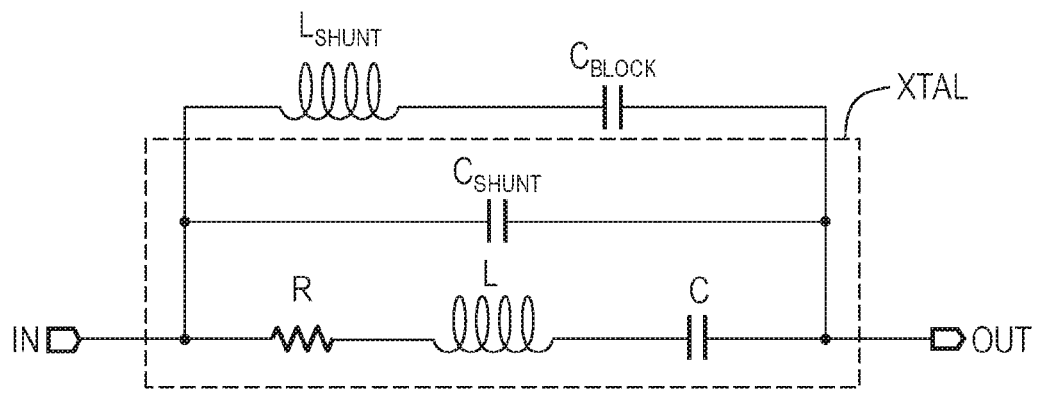
FIG. 12E is an electrical schematic of the BVD model of a single crystal resonator, which includes a shunt inductor ($L_{SHUNT}$) and blocking capacitor ($C_{BLOCK}$) to cancel the effects of the shunt capacitor ($C_{SHUNT}$), according to the prior art.

FIGS. 12C-12D illustrate a further approximation of the Pierce-type oscillator as an open-loop circuit 10'' with some conversions to ideal components that support AC analysis. As shown by FIG. 12D, the quartz crystal XTAL of FIGS. 12A-12C may be modeled as a series RLC circuit of "motional parameters" and a parasitic shunt capacitance ($C_{SHUNT}$), which typically dominates the crystal response at most frequencies. At frequencies that induce "motion" in a quartz blank, which is sandwiched between a pair of input/output electrodes, the motional parameters become part of the response, with odd harmonics ($3^{rd}$, $5^{th}$, etc.) and spurious modes modeled as additional series RLC networks (e.g., R'L'C', R''L''C'', . . . ), as shown. The parasitic shunt capacitance ($C_{SHUNT}$) of the resonator may be approximated as equivalent to a permittivity of the quartz crystal material times an overlapping area of the electrodes and divided by a thickness of the quartz blank. As shown by FIG. 12E, a conventional technique to cancel the effect of $C_{SHUNT}$ is to add a shunt inductor $L_{SHUNT}$ in parallel with the resonator along with a blocking capacitor ($C_{BLOCK}$), as disclosed in U.S. Pat. Nos. 5,250,871 and 7,170,357 to Driscoll et al., but such an inductor typically requires a prohibitive amount of area on a silicon chip and is typically not compatible with CMOS-based integrated circuit processing.

As will be understood by those skilled in the art, a cancellation of $C_{SHUNT}$ will typically cause a reduction in the in-circuit loss for the crystal resonator, reduce the power required to start and sustain oscillation and improve the close-in phase noise by increasing the loaded resonator Q. Moreover, if the crystal resonator is used in a voltage-controlled crystal oscillator (VCXO), the pulling range and sensitivity of the VCXO will typically be increased as the net $C_{SHUNT}$ is decreased.

Figure 13A:
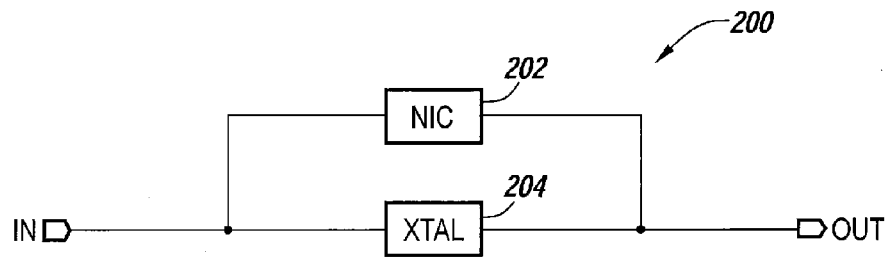
FIG. 13A is a block diagram of a crystal-based resonator in parallel with a negative impedance converter (NIC), according to embodiments of the present invention.
Figure 14A:
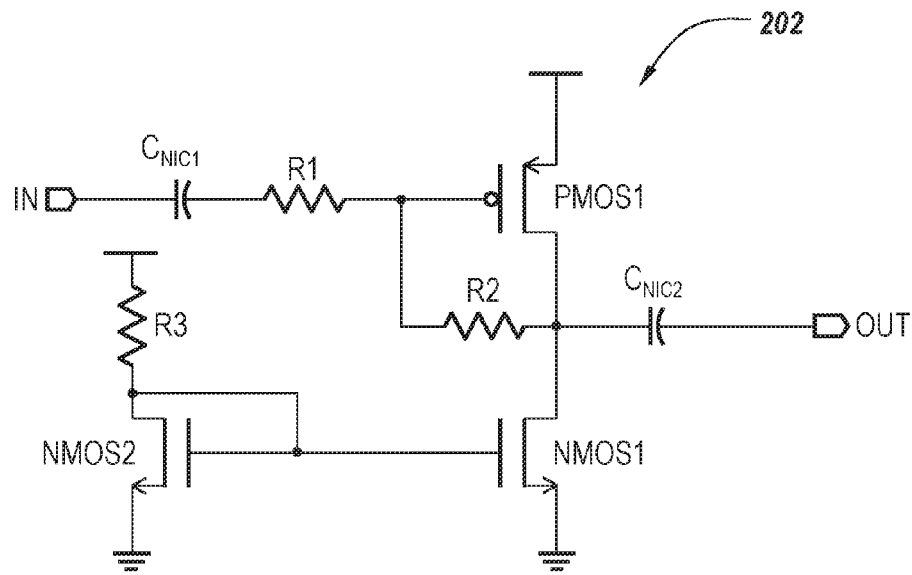
FIG. 14A is an electrical schematic of a CMOS-based negative impedance converter (NIC) according to embodiments of the invention.
Figure 14B:
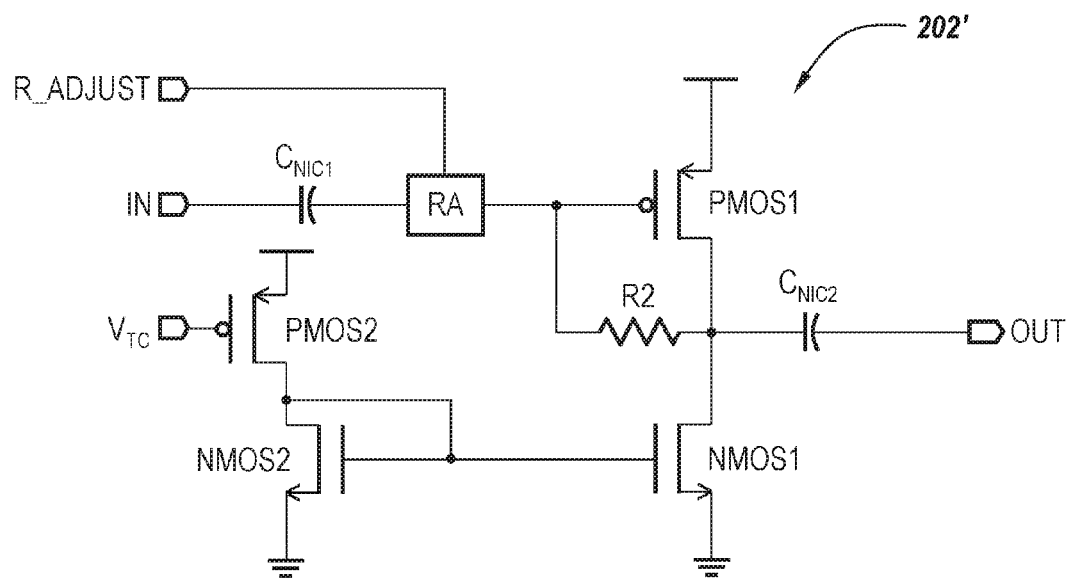
FIG. 14B is an electrical schematic of a programmable CMOS-based negative impedance converter (NIC) with temperature compensation, according to embodiments of the invention.

Referring now to FIGS. 13A and 14A, an integrated circuit device 200 according to an embodiment of the invention is illustrated as including a crystal-based resonator (XTAL) 204 in parallel with a CMOS-based negative impedance converter (NIC) 202, which preferably operates to fully cancel a shunt capacitance $C_{SHUNT}$ associated with the XTAL 204. As shown by FIG. 14A, an embodiment of a NIC 202, which is devoid of inductive reactance from a passive inductor, is illustrated as including a DC blocking capacitor $C_{NIC1}$, a gain capacitor $C_{NIC2}$, resistors R1, R2 and R3 and transistors PMOS1, NMOS1 and NMOS2, connected as illustrated. The NMOS transistors NMOS1, NMOS2 and pull-up resistor R3 operate collectively as a current mirror and the effective capacitance ($C_{EFF}$) as seen across the input/output terminals of the NIC 202 can be represented by the following equation:

$$C_{EFF}=(-R2/R1)(C_{NIC2})+k,$$

where "k" is proportional to the current in PMOS1 and includes the relatively small "capacitive" contribution of the DC blocking capacitor $C_{NIC1}$, where $C_{NIC1}$ may be greater than four times $C_{NIC2}$. Moreover, as shown by the NIC 202' of FIG. 14B, the resistor R1 of FIG. 14A may be configured as a resistor array (RA) with small step size so that the effective capacitance $C_{EFF}$ of the NIC 202' can support one-time (or dynamic) programmability during initial testing (or normal operation). In addition, the NIC 202' may be configured to support temperature compensation by substituting a PMOS pull-up transistor PMOS2, which is responsive to a temperature compensating gate signal ($V_{TC}$), for the pull-up resistor R3 shown in FIG. 14A.

Figure 13B:
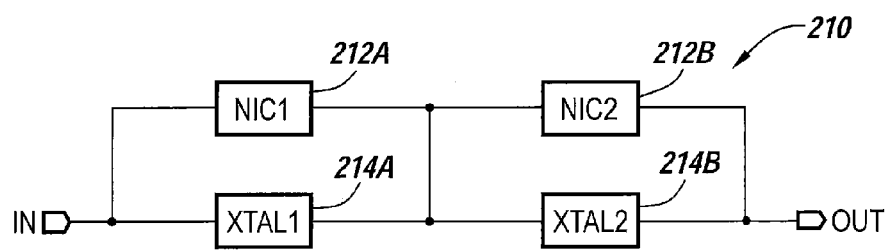
FIG. 13B is a block diagram of a plurality of serially-connected crystal-based resonators with respective negative impedance converters (NIC) according to embodiments of the invention.

Referring now to FIG. 13B, an integrated circuit device 210 according to another embodiment of the invention is illustrated as including a series combination of two crystal-based resonators (XTAL) 214A, 214B in parallel with respective CMOS-based negative impedance converters (NIC) 212A, 212B, which operate to fully cancel the parasitic shunt capacitance of each resonator. These NICs 212A, 212B allow the device 210 to more fully achieve the higher Q and better close-in phase noise performance available with the series combination of the resonators 214A, 214B, notwithstanding a somewhat reduced pulling range achievable with loading capacitors (see, e.g., FIG. 12C, with 5 pF loading capacitors) by virtue of the increased stiffness of the series crystal combination.

Figure 12F:
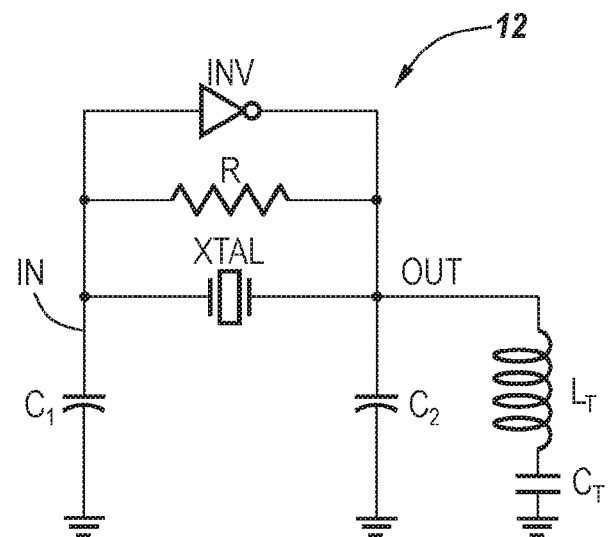
FIG. 12F is an electrical schematic of a Pierce-type oscillator with a third overtone crystal and trap circuit according to the prior art
Figure 13C:
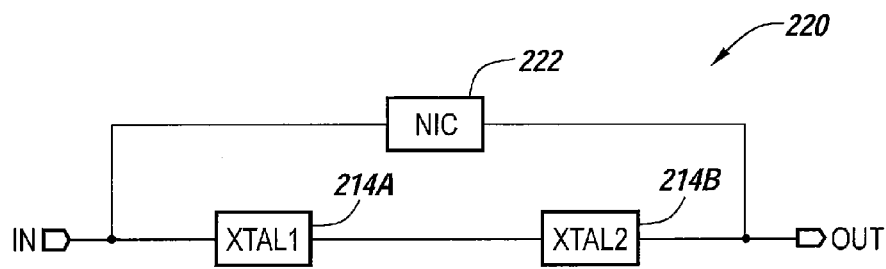
FIG. 13C is a block diagram of a plurality of serially-connected crystal-based resonators, which are connected in parallel with a negative impedance converter (NIC) according to embodiments of the invention.

In addition, as shown by FIG. 13C, an integrated circuit device 220 containing a series combination of crystal-based resonators (XTAL) 214A, 214B having equivalent (or closely equivalent) parasitic shunt capacitance may utilize a single NIC 222, which is connected across the series combination as shown. Furthermore, as shown by the integrated circuit device 230 of FIG. 13D, a NIC 222 may be connected across a series combination of a fundamental crystal resonator 216A and an overtone crystal resonator 216B (e.g., $3^{rd}$ overtone) and a second NIC 224 may be connected across the overtone crystal resonator 216B, as illustrated. Typically, one problem when using a third overtone crystal resonator is that without any extra precautions, an overtone-based crystal oscillator may more readily start on the fundamental mode because the effective resistance of the resonator is lower, the Q is lower and the gain of the oscillator amplifier is higher at the lower fundamental frequency. A number of techniques exist to suppress the fundamental response and operate reliably on the third overtone. One technique includes using a trap circuit, which typically includes an inductor-capacitor network to ground, which can be put in parallel with a load capacitor (see, e.g., FIG. 12C, with 5 pF loading capacitors) and configured so that the resulting phase is inappropriate to start (or sustain) oscillations at the fundamental frequency (i.e., the oscillator loop phase is unequal to n*360° at the fundamental frequency). This technique is further illustrated by the Pierce-type oscillator 12 of FIG. 12F, which contains a third overtone crystal (XTAL) and trap circuit ($L_T C_T$), connected as illustrated. One drawback to this conventional technique is that both the inductor and capacitor values are typically too big to integrate easily in a CMOS compatible integrated circuit and the use of external L and C components typically adds too much to size and cost.

Figure 13D:
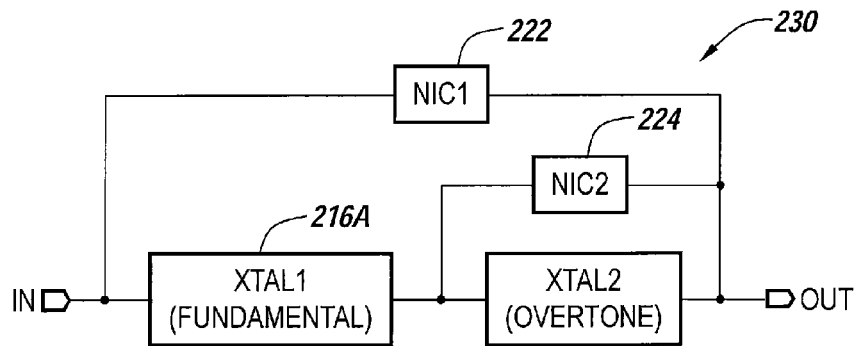
FIG. 13D is a block diagram of a plurality of serially-connected crystal-based resonators with negative impedance converters (NIC) according to embodiments of the invention.

However, as shown by the integrated circuit device 230 of FIG. 13D, by using a fundamental crystal resonator 216A having a relatively reduced Q to preferably pass its fundamental frequency to the $3^{rd}$ overtone (or higher) crystal resonator 216B having a relatively higher Q, the fundamental resonator 216A can operate as a pre-filter to the series combination, which can obviate any need for a conventional and relatively large LC-based trap circuit. Moreover, because the fundamental crystal resonator 216A and the overtone crystal resonator 216B can be mechanically oriented in anti-parallel such that their respective acceleration vectors are in opposite directions and because the acceleration vectors are not necessarily that dissimilar in magnitude, a second NIC 224 may be provided across the overtone crystal resonator 216B in order to finely adjust (i.e., "weight") a magnitude of the acceleration vector associated with the overtone crystal resonator 216B and provide complete acceleration vector cancellation.

Figure 8B:
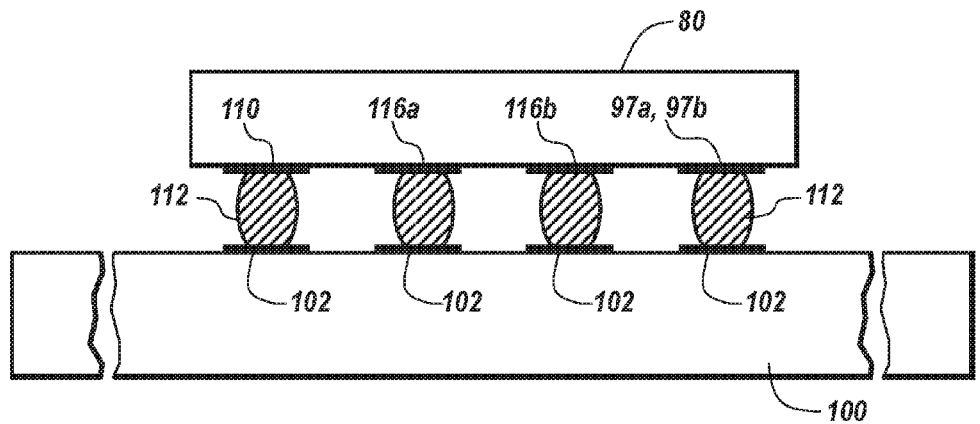
FIG. 8B is a cross-sectional illustration of a packaged crystal resonator and/or inductor, which is solder bonded to an underlying integrated circuit substrate (e.g., semiconductor chip), according to an embodiment of the invention.
Figure 15A:
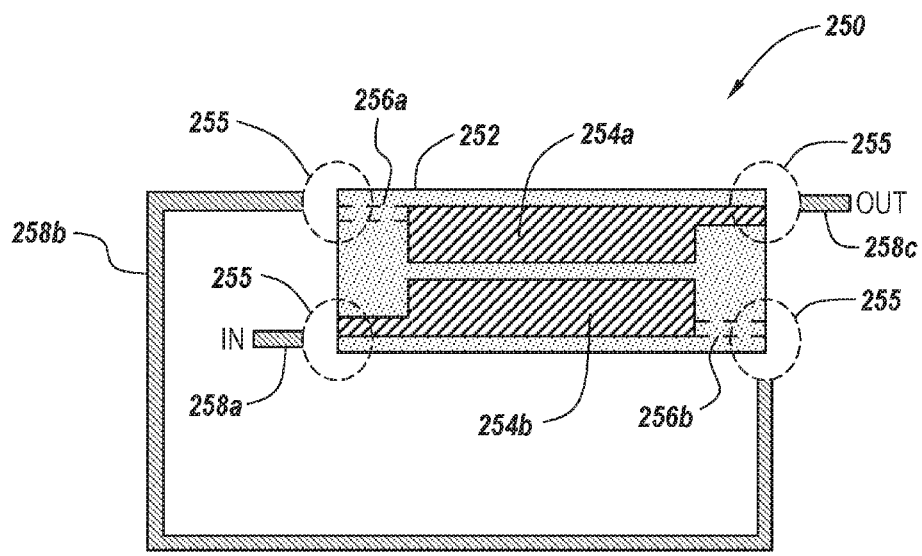
FIG. 15A is a plan view of a monolithic resonator containing two crystal-based resonators mechanically coupled in anti-parallel and electrically coupled in series, according to embodiments of the invention.

FIG. 15A illustrates a monolithic multi-resonator device 250 that may be packaged within a sealed cavity 82 and mounted to an underlying integrated circuit substrate 100 (e.g., CMOS-compatible semiconductor chip) in a similar manner as shown for the two-terminal crystal resonator 84 in FIGS. 8A-8B. This multi-resonator device 250 includes a rectangular-shaped quartz blank 252 having a predetermined length (L) and width (W), where L>W, as illustrated. First and second pairs of electrodes are provided on the quartz blank 252 to thereby define two quartz resonators, which are mechanically coupled in anti-parallel to provide a high degree of "passive" acceleration vector cancellation. In particular, the first quartz resonator includes top and bottom electrodes 254a/256a extending in a lengthwise direction across one side of the quartz blank 252 and the second quartz resonator includes top and bottom electrodes 254b/256b extending in a lengthwise direction across another side of the quartz blank 252. Two pairs of input and output terminals 255, which may be formed as electrically conductive adhesion bumps (e.g., conductive epoxy), are provided at opposing ends of the quartz blank 252. As further shown by FIG. 15A, the second top electrode 254b is a 180°-rotated version of the first top electrode 254a and the second bottom electrode 256b is a 180°-rotated version of the first bottom electrode 256a.

In some embodiments of the invention, the quartz blank 252 may have a non-uniform thickness across its width, such that the vertical spacing between the top and bottom electrodes 254a/256a of one resonator is unequal to the vertical spacing between the top and bottom electrodes 254b/256b of the other resonator. In this manner, the two side-by-side resonators may be configured to preferentially support either a fundamental mode of operation (e.g., thinner side) or an overtone mode of operation (e.g., thicker side).

Figure 15B:
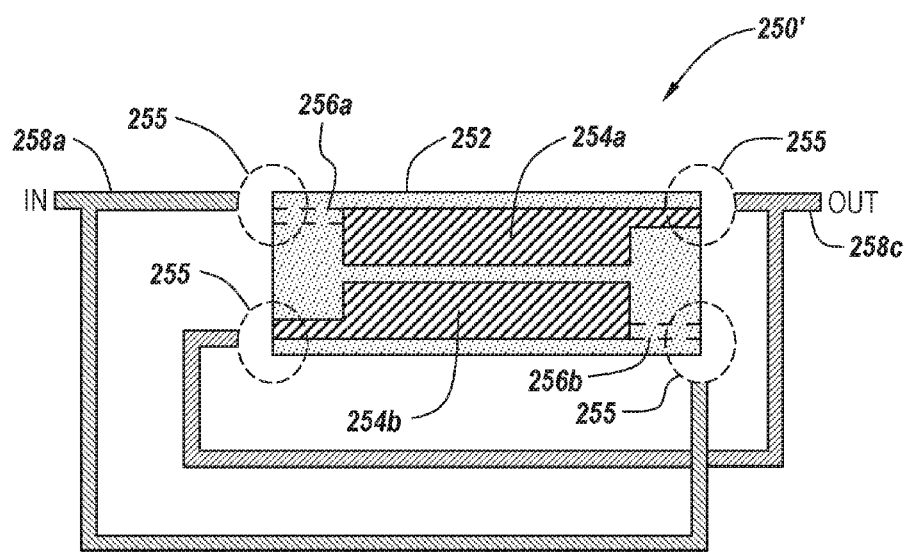
FIG. 15B is a plan view of a monolithic resonator containing two crystal-based resonators mechanically coupled in anti-parallel and electrically coupled in parallel, according to embodiments of the invention.

The resonator device 250 of FIG. 15A further illustrates electrically conductive traces 258a (IN), 258b and 258c (OUT), which may be patterned on a bottom surface 91 of the cap 86, as illustrated by FIG. 8A. These electrically conductive traces 258a-258c support the series electrical connection between a pair of resonators, as shown by the fundamental and overtone resonators 216A-216B of FIG. 13D. Thus, the top/bottom electrode pair 254a/256a may define the overtone resonator 216B of FIG. 13D and the top/bottom electrode pair 254b/256b may define the fundamental resonator 216A of FIG. 13D. Alternatively, the top/bottom electrode pair 254a/256a may define the second resonator 214B of FIGS. 13B-13C and the top/bottom electrode pair 254b/256b may define the first resonator 214A of FIGS. 13B-13C. In contrast, FIG. 15B illustrates a multi-resonator device 250' that is otherwise equivalent to the multi-resonator device 250 of FIG. 15A, except the pair of electrically conductive traces 258a, 258c support a parallel electrical connection between a pair of resonators.

Figure 16A:
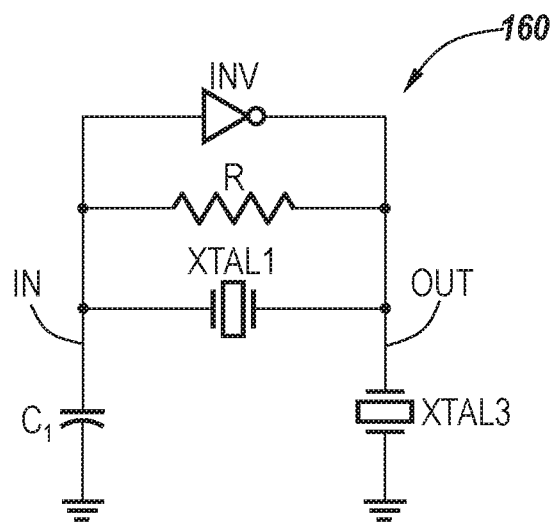
FIG. 16A is an electrical schematic of a Pierce-type oscillator circuit according to an embodiment of the present invention, which replaces a parallel combination of a capacitor and LC-based trap circuit with a crystal resonator (XTAL3).
Figure 16B:
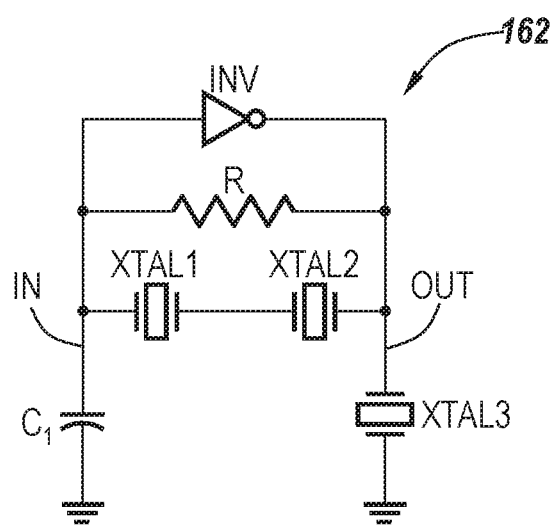
FIG. 16B is an electrical schematic of a Pierce-type oscillator circuit according to an embodiment of the present invention, which contains a series combination of a fundamental crystal (XTAL2) and a third overtone crystal (XTAL1).
Figure 16C:
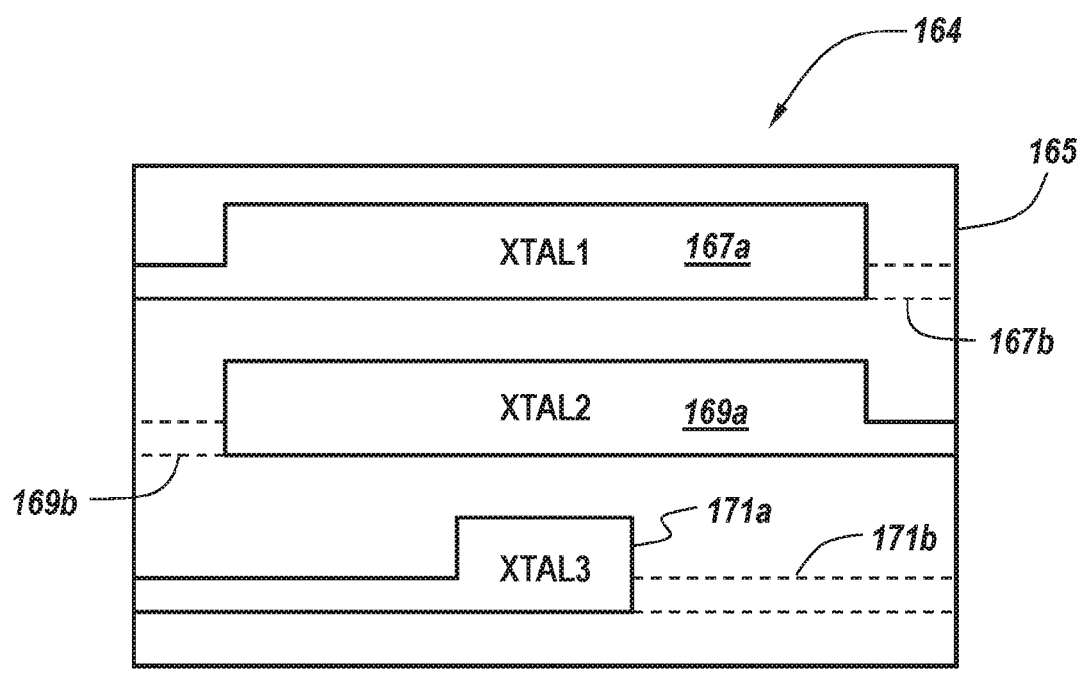
FIG. 16C is a plan view of a monolithic resonator containing three crystal-based resonators, which can be utilized in the Pierce-type oscillator circuit of FIG. 16B.

Referring now to FIG. 16A, a Pierce-type oscillator circuit 160 according to an embodiment of the present invention is illustrated as including a third overtone crystal resonator (XTAL1) between the input and output nodes (IN, OUT) and a "trap" crystal resonator (XTAL3), which supports third overtone resonance by performing essentially the same function as the parallel combination of the output capacitor C2 and LC-based trap circuit ($L_T C_T$) of FIG. 12F. As will be understood by those skilled in the art, the shunt capacitance of XTAL3 can be designed to match the value of C2 and the motional parameters of XTAL3 can be designed to match the desired values of ($L_T C_T$). In addition, as shown by the Pierce-type oscillator circuit 162 of FIG. 16B, a fundamental crystal resonator XTAL2 may be connected in series with the third overtone crystal resonator XTAL1 of FIG. 16A, to thereby achieve the performance advantages highlighted above with respect to FIGS. 13B-13D. Although not shown in FIG. 16B, each of the crystal resonators XTAL1, XTAL2 may be coupled to a corresponding NIC as previously described herein. Finally, as shown by FIG. 16C, a monolithic multi-resonator device 164 may include a single crystal resonator blank 165 to provide the three crystal resonators XTAL-XTAL3 of FIG. 16B, which are defined by respective top and bottom electrodes 167a/167b, 169a/169b and 171a/171b, which have shapes and relative orientations that are similar to the top and bottom electrodes shown in FIGS. 15A-15B.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device, comprising:
a pair of serially-connected crystal resonators arranged as a first crystal resonator configured to support a fundamental resonance mode in response to an input signal and a second crystal resonator configured to support a third or higher overtone resonance mode in response to a signal generated at an output terminal of the first crystal resonator; and
a first negative impedance converter (NIC) having an input terminal electrically connected to an input terminal of the first crystal resonator and an output terminal electrically connected to one of the output terminal of the first crystal resonator and the output terminal of the second crystal resonator.

2. The device of claim 1, wherein the first NIC is a CMOS-based NIC that is devoid of inductive reactance from a passive inductor.

3. The device of claim 1, wherein the first NIC is a temperature-compensated NIC.

4. The device of claim 3, wherein the temperature-compensated NIC is responsive to a reference voltage having a magnitude that varies in response to changes in temperature of said pair of serially-connected crystal resonators.

5. The device of claim 1, wherein the first NIC comprises a programmable resistor array.

6. The device of claim 1, further comprising an acceleration vector weighting circuit having a first terminal electrically connected to an input terminal of the second crystal resonator and a second terminal electrically connected to the output terminal of the second crystal resonator.

7. The device of claim 6, wherein the acceleration vector weighting circuit is a programmable circuit configured to decrease an effective shunt capacitance of the second crystal resonator relative to the first crystal resonator.

8. The device of claim 6, wherein the acceleration vector weighting circuit comprises a second NIC that is devoid of inductive reactance from a passive inductor.

9. An integrated circuit device, comprising:
a plurality of serially-connected resonators; and
a programmable negative impedance converter (NIC) configured to mimic a negative capacitive reactance, said programmable NIC having at least a first terminal electrically connected to a first of said plurality of serially-connected resonators;
wherein said programmable NIC is a one-time programmable and temperature-compensated NIC, which is electrically connected across the first of said plurality of serially-connected resonators and is responsive to a reference voltage having a magnitude that varies in response to changes in temperature in the integrated circuit device.

10. The device of claim 9, wherein said programmable NIC is a CMOS-based NIC that is devoid of inductive reactance from a passive inductor.

11. The device of claim 9, further comprising an integrated circuit substrate having an at least two-piece package thereon with a sealed cavity therein containing said plurality of serially-connected resonators.

12. An integrated circuit device, comprising:
a plurality of serially-connected resonators;
a programmable negative impedance converter (NIC) configured to mimic a negative capacitive reactance, said programmable NIC having at least a first terminal electrically connected to a first of said plurality of serially-connected resonators; and
an integrated circuit substrate having an at least two-piece package thereon with a sealed cavity therein containing said plurality of serially-connected resonators;
wherein at least a pair of said plurality of serially-connected resonators are oriented within the sealed cavity so that their respective net acceleration vectors are in antiparallel relative to each other; and wherein said programmable NIC is a CMOS-based NIC within the integrated circuit substrate.

13. The device of claim 12, wherein said programmable NIC is configured to weight a net acceleration vector associated with a first of the pair of serially-connected resonators more heavily relative to a net acceleration vector associated with a second of the pair of serially-connected resonators.

14. An integrated circuit device, comprising:
a monolithic multi-resonator device comprising a rectangular-shaped quartz blank having first and second pairs of electrodes thereon that define two quartz resonators, which are mechanically coupled in anti-parallel and have respective input and output terminals at opposing ends of the rectangular-shaped quartz blank, said first pair of electrodes including a first top electrode and underlying first bottom electrode and said second pair of electrodes including a second top electrode, which is patterned as a 180°-rotated version of the first top electrode, and an underlying second bottom electrode, which is patterned as a 180°-rotated version of the first bottom electrode;
an at least two-piece package having a sealed cavity therein containing said monolithic multi-resonator device; and wherein the two quartz resonators are electrically connected in series within the at least two-piece package; and
an integrated circuit substrate having a programmable negative impedance converter (NIC) therein, which is configured to mimic a negative capacitive reactance, said programmable NIC having first and second terminals electrically connected to corresponding input and output terminals of one of the two quartz resonators within the at least two-piece package.

15. The device of claim 14, wherein the rectangular-shaped quartz blank has a nonuniform thickness across its width so that a spacing between the first top and bottom electrodes is unequal to a spacing between the second top and bottom electrodes.

16. The device of claim 14, wherein said programmable NIC is a CMOS-based NIC that is devoid of inductive reactance from a passive inductor.

* * * * *